US012677468B2

(12) United States Patent
Lee et al.

(10) Patent No.: US 12,677,468 B2
(45) Date of Patent: Jul. 7, 2026

(54) SEMICONDUCTOR DEVICE INCLUDING SOURCE/DRAIN PATTERN HAVING HIGH CONCENTRATION IMPURITY REGION AND METHOD FOR FABRICATING THE SAME

(71) Applicant: SAMSUNG ELECTRONICS CO., LTD., Suwon-si (KR)

(72) Inventors: Doo Hyun Lee, Hwaseong-si (KR); Heon Jong Shin, Yongin-si (KR); Hyun Ho Park, Suwon-si (KR); Seon-Bae Kim, Hwaseong-si (KR); Jin Young Park, Hwaseong-si (KR); Jae Ran Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 597 days.

(21) Appl. No.: 18/054,890

(22) Filed: Nov. 11, 2022

(65) Prior Publication Data

US 2023/0207654 A1      Jun. 29, 2023

(30) Foreign Application Priority Data

Dec. 29, 2021      (KR) ......................... 10-2021-0191106

(51) Int. Cl.
*H10D 64/62*      (2025.01)
*H10D 30/01*      (2025.01)
(Continued)

(52) U.S. Cl.
CPC ........... *H10D 64/62* (2025.01); *H10D 30/014* (2025.01); *H10D 30/031* (2025.01); *H10D 30/43* (2025.01);
(Continued)

(58) Field of Classification Search
CPC .... H10D 64/62; H10D 30/014; H10D 30/031; H10D 30/43; H10D 30/6729;
(Continued)

(56) References Cited

U.S. PATENT DOCUMENTS

| | | | |
|---|---|---|---|
| 10,032,672 B1 | 7/2018 | Hung et al. | |
| 10,325,911 B2 | 6/2019 | Lu et al. | |

(Continued)

FOREIGN PATENT DOCUMENTS

| | | |
|---|---|---|
| KR | 10-2008-0098894 | 11/2008 |
| KR | 10-2016-0011742 | 2/2016 |

(Continued)

OTHER PUBLICATIONS

Office Action dated Aug. 25, 2025 issued in Korean Patent Application No. KR 10-2021-0191106. Note: US 2018/0166571 A and US 2020/0044045 A cited therein are already of record.).

*Primary Examiner* — Norman D Richards
*Assistant Examiner* — Ethan Edward Cutler
(74) *Attorney, Agent, or Firm* — MORGAN, LEWIS & BOCKIUS LLP

(57)      ABSTRACT

A semiconductor device includes an active pattern that extends in a first direction; a plurality of gate structures that are spaced apart in the first direction, and include a gate electrode that extends in a second direction; a source/drain recess between adjacent gate structures; a source/drain pattern in the source/drain recess; a source/drain contact connected to the source/drain pattern and that includes a lower part on the source/drain pattern and an upper par; and a contact silicide film disposed along the lower part of the source/drain contact and between the source/drain contact and the source/drain region. The source/drain pattern includes a semiconductor liner film that extends along the source/drain recess and includes silicon germanium, a semi-
(Continued)

conductor filling film on the semiconductor liner film and that includes silicon germanium, and a semiconductor insertion film that extends along side walls of the lower part of the source/drain contact and includes silicon germanium.

20 Claims, 28 Drawing Sheets

(51) Int. Cl.
| | |
|---|---|
| *H10D 30/43* | (2025.01) |
| *H10D 30/67* | (2025.01) |
| *H10D 62/10* | (2025.01) |
| *H10D 62/13* | (2025.01) |
| *H10D 62/832* | (2025.01) |
| *H10D 64/01* | (2025.01) |

(52) U.S. Cl.
CPC ..... *H10D 30/6729* (2025.01); *H10D 30/6735* (2025.01); *H10D 62/121* (2025.01); *H10D 62/151* (2025.01); *H10D 62/832* (2025.01); *H10D 64/01* (2025.01); *H10D 64/0112* (2026.01); *H10D 64/017* (2025.01)

(58) Field of Classification Search
CPC .............. H10D 30/6735; H10D 62/121; H10D 62/151; H10D 62/832; H10D 64/01; H10D 64/017; H10D 30/6757; H10D 30/62; H10D 30/797; H10D 30/6219; H10D 64/258; H10D 62/822; H10D 64/256; H10D 30/023; H10D 30/024; H10D 30/6215; H10D 62/10; H10D 62/118; H10D 62/119; H10D 62/124; H10D 64/251; H10D 64/512; H10D 30/611; H10D 64/252; H10D 84/834; H10D 30/6713; H01L 21/28518; H01L 21/76805; H01L 21/76843; H01L 21/76855; H01L 23/485; B82Y 10/00
See application file for complete search history.

(56) References Cited

U.S. PATENT DOCUMENTS

| | | | |
|---|---|---|---|
| 10,665,608 B2 | 5/2020 | Shioda et al. | |
| 10,818,543 B2 | 10/2020 | Wu | |
| 11,004,984 B2 | 5/2021 | Wu et al. | |
| 2008/0157224 A1* | 7/2008 | Fischer | H10D 30/797 |
| | | | 257/E29.255 |
| 2018/0166571 A1* | 6/2018 | Liu | H10D 30/0227 |
| 2019/0273024 A1* | 9/2019 | Li | H01L 21/76889 |
| 2020/0044045 A1* | 2/2020 | Wang | H10D 62/151 |
| 2021/0035976 A1 | 2/2021 | Gwon et al. | |
| 2021/0151319 A1 | 5/2021 | Kim et al. | |

FOREIGN PATENT DOCUMENTS

| | | |
|---|---|---|
| KR | 10-2021-0013811 A | 2/2021 |
| KR | 10-2023-0048184 | 4/2023 |

* cited by examiner

SEMICONDUCTOR DEVICE INCLUDING SOURCE/DRAIN PATTERN HAVING HIGH CONCENTRATION IMPURITY REGION AND METHOD FOR FABRICATING THE SAME

CROSS-REFERENCE TO RELATED APPLICATION

This application claims priority under 35 U.S.C. 119 from Korean Patent Application No. 10-2021-0191106, filed on Dec. 29, 2021 in the Korean Intellectual Property Office, the contents of which are herein incorporated by reference in their entirety.

TECHNICAL FIELD

Embodiments of the present disclosure are directed to a semiconductor device and a method for fabricating the same.

DISCUSSION OF THE RELATED ART

As one of scaling techniques for increasing the density of semiconductor devices, a multi gate transistor has been proposed in which a fin or nanowire-shaped multi channel active pattern or a silicon body is formed on a substrate and a gate is formed on a surface of the multi channel active pattern.

Since such a multi gate transistor utilizes a three-dimensional channel, scaling is easily performed. Further, the current control capability can be improved even without increasing a gate length of the multi gate transistor. Furthermore, a SCE (short channel effect) in which the potential of channel region is affected by a drain voltage can be effectively suppressed.

SUMMARY

Embodiments of the present disclosure provide a semiconductor device that reduces a contact resistance between a source/drain and a contact to increases performance and reliability.

Embodiments of the present disclosure also provide a method for fabricating a semiconductor device that reduces the contact resistance between the source/drain and the contact and increases performance and reliability.

According to an embodiment of the present disclosure, there is provided a semiconductor device that includes an active pattern that extends in a first direction; a plurality of gate structures disposed on the active pattern and that are spaced apart in the first direction on the active pattern, and include a gate electrode that extends in a second direction that crosses the first direction; a source/drain recess formed between adjacent gate structures; a source/drain pattern disposed in the source/drain recess on the active pattern; a source/drain contact that is connected to the source/drain pattern, and includes a lower part and an upper part, where the lower part of the source/drain contact is disposed in the source/drain pattern; and a contact silicide film disposed along a profile of the lower part of the source/drain contact and between the source/drain contact and the source/drain pattern. The source/drain pattern includes a semiconductor liner film that extends along the source/drain recess and includes silicon germanium, a semiconductor filling film disposed on the semiconductor liner film and that includes silicon germanium, and a semiconductor insertion film that extends along side walls of the lower part of the source/drain contact and includes silicon germanium.

According to an embodiment of the present disclosure, there is provided a semiconductor device that includes an active pattern that includes a lower pattern that extends in a first direction, and a sheet pattern spaced apart from the lower pattern in a second direction that crosses the first direction; a plurality of gate structures that include gate electrodes that are spaced apart from each other in the first direction on the active pattern and surround the sheet pattern, where the gate electrodes extend in a third direction that is normal to a plane defined by the first direction and the second direction; a source/drain pattern disposed on the lower pattern, wherein the source/drain pattern is connected to the sheet pattern and includes a contact recess; a contact silicide that extends along a profile of the contact recess; and a source/drain contact disposed on the contact silicide and that fills the contact recess. The source/drain pattern includes a semiconductor liner film that includes silicon germanium and is disposed on the lower pattern, a semiconductor filling film that includes silicon germanium and is disposed on the semiconductor liner film, and a semiconductor insertion film that includes silicon germanium and is disposed on the semiconductor filling film. A germanium fraction of the semiconductor filling film differs from a germanium fraction of the semiconductor liner film and a germanium fraction of the semiconductor insertion film, and at least a part of the contact recess is defined by the semiconductor insertion film.

According to an embodiment of the present disclosure, there is provided a semiconductor device that includes an active pattern that includes a lower pattern, and a sheet pattern disposed on the lower pattern; a gate structure disposed on the active pattern and that includes a gate electrode that surrounds the sheet pattern; a source/drain pattern disposed on the lower pattern and is connected to the sheet pattern and includes p-type impurities; a source/drain contact that is connected to the source/drain pattern and includes a lower part and the upper part, where the lower part of the source/drain contact is disposed in the source/drain pattern; and a contact silicide film disposed along a profile of the lower part of the source/drain contact between the source/drain contact and the source/drain pattern. The source/drain pattern includes a silicon germanium liner film disposed on the lower pattern, a silicon germanium filling film disposed on the silicon germanium liner film and that includes a filling film recess, and a silicon germanium insertion film disposed on the silicon germanium filling film and that extends along at least a part of the filling film recess. A germanium fraction of the silicon germanium filling film differs from a germanium fraction of the silicon germanium liner film and a germanium fraction of the silicon germanium insertion film, and a concentration of p-type impurities of the silicon germanium insertion film is greater than a concentration of p-type impurities of the silicon germanium filling film.

BRIEF DESCRIPTION OF DRAWINGS

FIGS. 20 to 28 illustrate a method for fabricating a semiconductor device according to some embodiments.

DETAILED DESCRIPTION

Although drawings of a semiconductor device according to some embodiments show a fin-type transistor (FinFET) that includes a channel region of a fin-type pattern shape, a transistor that includes a nanowire or a nanosheet, and a MBCFET™ (Multi-Bridge Channel Field Effect Transistor) as an example, embodiments are not necessarily limited thereto. A semiconductor device according to some embodiments may include a tunneling transistor (tunneling FET) or a three-dimensional (3D) transistor. A semiconductor device according to some embodiments may include a planar transistor. In addition, the technical idea of the present disclosure may be applied to a transistor based on two-dimensional material (2D material based FETs) and a heterostructure thereof.

Further, a semiconductor device according to some embodiments may also include a bipolar junction transistor, a laterally diffused metal oxide semiconductor (LDMOS), etc.

A semiconductor device according to some embodiments will be described with reference to FIGS. 1 to 5.

Figure 1:
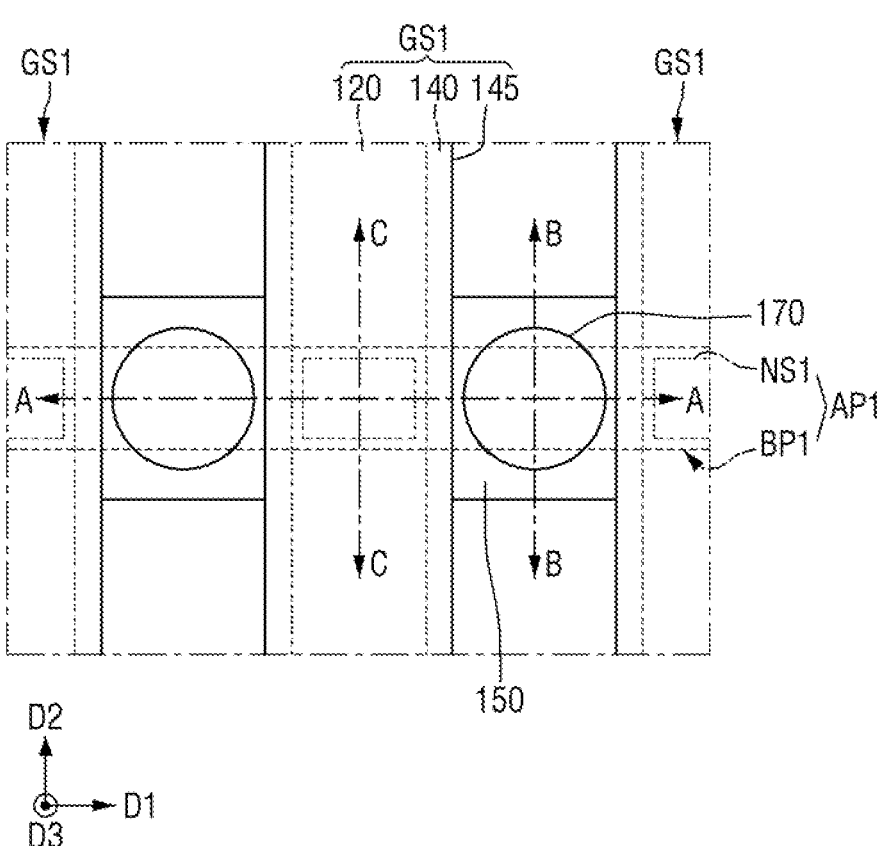
FIG. 1 is a plan view of a semiconductor device according to some embodiments.
Figure 2:
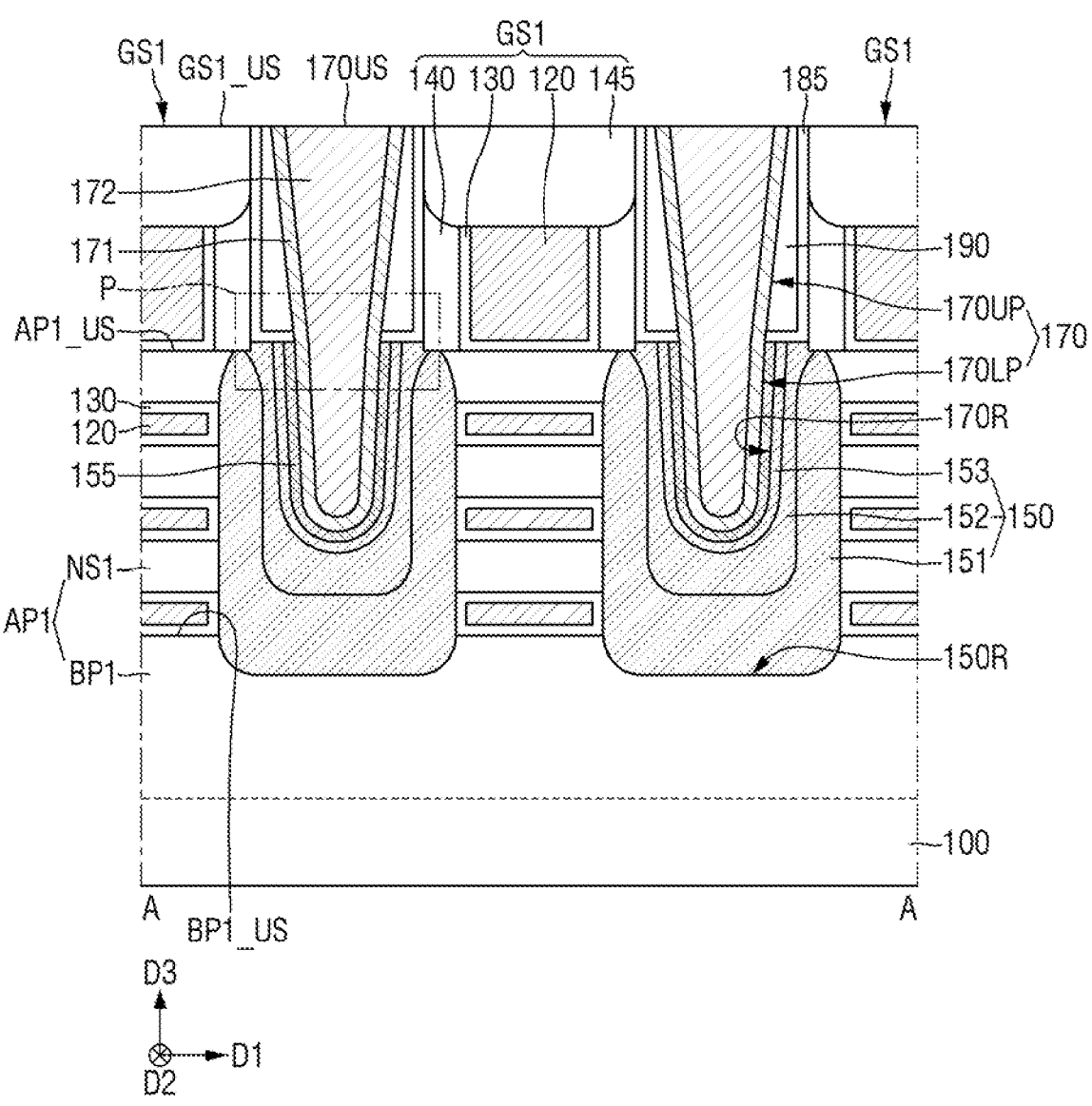
FIG. 2 is a cross-sectional view taken along line A-A of FIG. 1.
Figure 3:
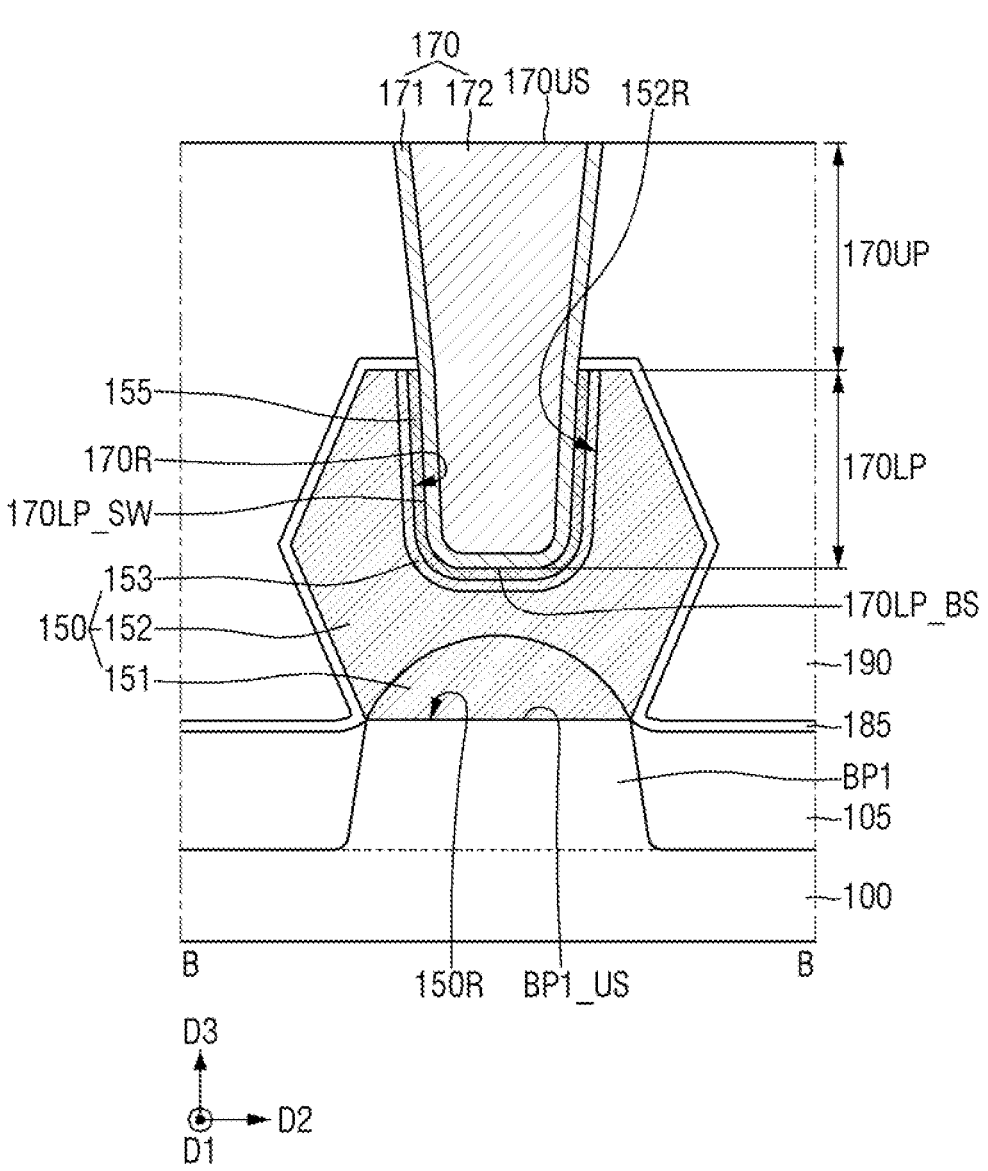
FIG. 3 is a cross-sectional view taken along line B-B of FIG. 1.
Figure 4:
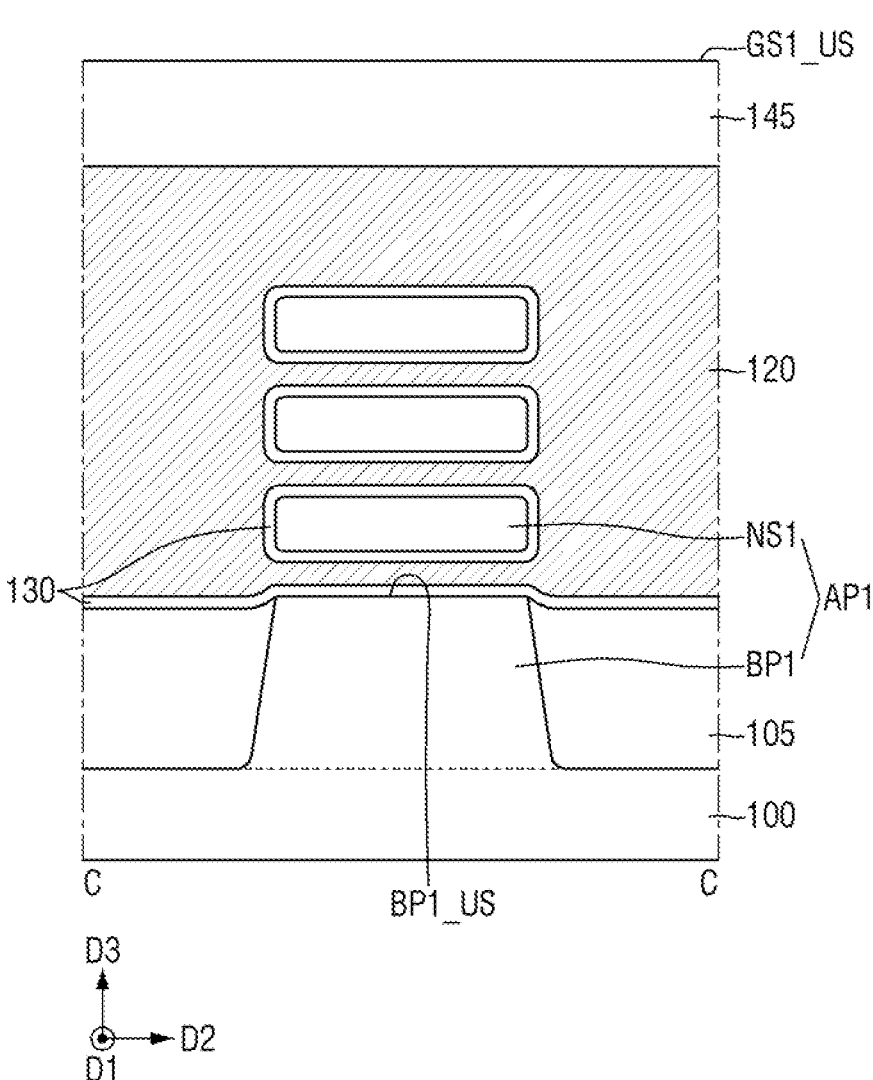
FIG. 4 is a cross-sectional view taken along line C-C of FIG. 1.
Figure 5:
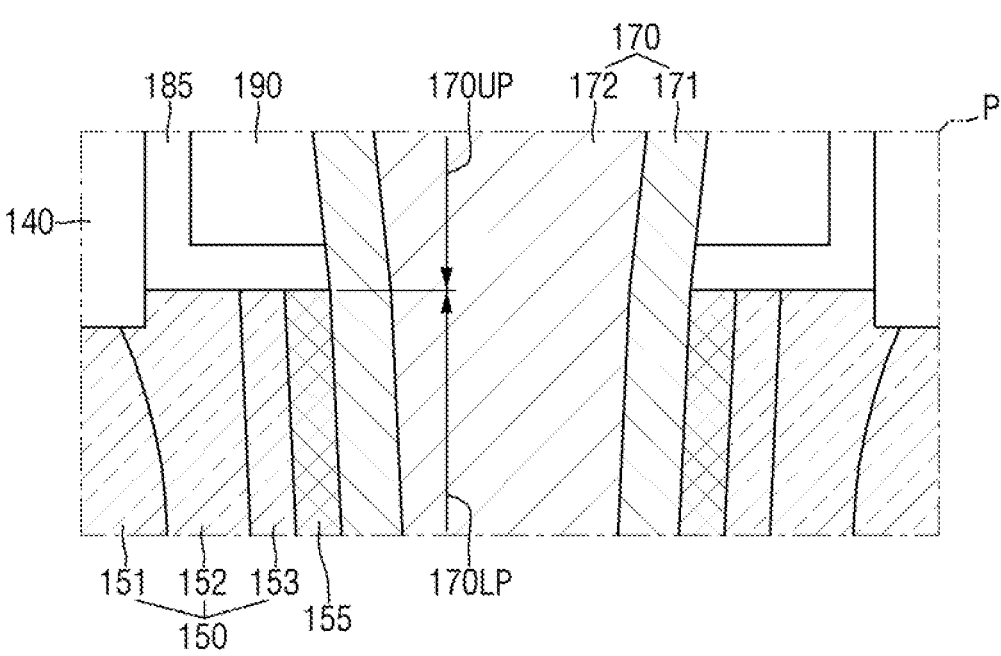
FIG. 5 is an enlarged view of portion P of FIG. 2.

FIG. 1 is a plan view of a semiconductor device according to some embodiments. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIG. 5 is an enlarged view of portion P of FIG. 2.

For simplicity of illustration, FIG. 1 does not show a first gate insulating film 130, a source/drain etching stop film 185, an interlayer insulating film 190, etc.

Referring to FIGS. 1 to 5, in an embodiment, a semiconductor device according to some embodiments includes a substrate 100, a first active pattern AP1, a plurality of first gate structures GS1, a first source/drain pattern 150, and a first source/drain contact 170.

The substrate 100 may be a bulk silicon or a silicon on insulator (SOI). The substrate 100 may also be a silicon substrate, or may include, but is not necessarily limited to, other materials, such as silicon germanium, silicon germanium on insulator (SGOI), indium antimonide, lead tellurium compounds, indium arsenic, indium phosphate, gallium arsenide or antimonide gallium.

The first active pattern AP1 is disposed on the substrate 100. The first active pattern AP1 extends along a first direction D1. For example, the first active pattern AP1 is disposed in a region in which a PMOS is formed. In addition, the first active pattern AP1 is separated or spaced apart from other active patterns in a second direction D2 that intersects the first direction D1.

The first active pattern AP1 is, for example, a multi-channel active pattern. The first active pattern AP1 includes a first lower pattern BP1 and a plurality of first sheet patterns NS1.

The first lower pattern BP1 protrudes from the substrate 100 in a third direction D3 that is normal to a plane defined by the first and second directions D1 and D2. For example, the third direction D3 may be a thickness direction of the substrate 100. The first lower pattern BP1 extends along the first direction D1. The first lower pattern BP1 has a fin type pattern shape.

The plurality of first sheet patterns NS1 are disposed on an upper surface BP1_US of the first lower pattern BP1. The plurality of first sheet patterns NS1 are spaced apart from the first lower pattern BP1 in the third direction D3. Each of the first sheet patterns NS1 are spaced apart in the third direction D3.

Each first sheet pattern NS1 includes an upper surface and a lower surface. The upper surface of the first sheet pattern NS1 is opposite to the lower surface of the first sheet pattern NS1 in the third direction D3. An upper surface AP1_US of the first active pattern an uppermost upper surface of the plurality of first sheet patterns NS1.

Although the figures show three first sheet patterns NS1 stacked in the third direction D3, this is for convenience of illustration, and embodiments are not necessarily limited thereto.

The first lower pattern BP1 is formed by etching a part of the substrate 100, and includes an epitaxial layer grown from the substrate 100. The first lower pattern BP1 includes silicon or germanium, which is an elemental semiconductor material. Further, the first lower pattern BP1 includes a compound semiconductor, and includes, for example, at least one of a group IV-IV compound semiconductor or a group III-V compound semiconductor.

The group IV-IV compound semiconductor includes, for example, at least one of a binary compound or a ternary compound that includes at least two or more of carbon (C), silicon (Si), germanium (Ge), or tin (Sn), or a compound obtained by doping these elements with a group IV element.

The group III-V compound semiconductor includes, for example, at least one of a binary compound, a ternary compound or a quaternary compound formed by combining at least one of aluminum (Al), gallium (Ga) or indium (In) as a group III element with one of phosphorus (P), arsenic (As) or antimony (Sb) as a group V element.

The first sheet pattern NS1 includes one of silicon or germanium, a group IV-IV compound semiconductor, or a group III-V compound semiconductor. Each first sheet pattern NS1 may include the same material as the first lower pattern BP1, and/or may include a different material from the first lower pattern BP1.

In a semiconductor device according to some embodiments, the first lower pattern BP1 is a silicon lower pattern that includes silicon, and the first sheet pattern NS1 is a silicon sheet pattern that includes silicon.

A width of the first sheet pattern NS1 in the second direction D2 increases or decreases in proportion to a width of the first lower pattern BP1 in the second direction D2. For example, although widths in the second direction D2 of the first sheet patterns NS1 stacked in the third direction D3 are shown as being the same, this is for convenience of illustration, and embodiments are not necessarily limited thereto. In an embodiment, the width in the second direction D2 of the first sheet patterns NS1 stacked in the third direction D3 decreases with increasing distance from the first lower pattern BP1.

A field insulating film 105 is formed on the substrate 100. The field insulating film 105 is disposed on the side walls of the first lower pattern BP1. The field insulating film 105 is not disposed on the upper surface BP1_US of the first lower pattern.

For example, the field insulating film 105 completely covers the side walls of the first lower pattern BP1. However, in an embodiment, the field insulating film 105 covers a part of the side walls of the first lower pattern BP1. A part of the first lower pattern BP1 protrudes from the upper surface of the field insulating film 105 in the third direction D3.

Each first sheet pattern NS1 is located higher than the upper surface of the field insulating film 105. The field insulating film 105 includes, for example, at least one of an oxide film, a nitride film, an oxynitride film or a combination film thereof. Although the field insulating film 105 is shown as a single film, this is for convenience of illustration, and embodiments are not necessarily limited thereto.

A plurality of first gate structures GS1 are disposed on the substrate 100. Each first gate structure GS1 extends in the second direction D2. Adjacent first gate structures GS1 are spaced apart from each other in the first direction D1.

The first gate structure GS1 is disposed on the first active pattern AP1. The first gate structure GS1 crosses the first active pattern AP1.

The first gate structure GS1 crosses the first lower pattern BP1. The first gate structure GS1 surrounds each first sheet pattern NS1.

The first gate structure GS1 includes, for example, a first gate electrode 120, a first gate insulating film 130, a first gate spacer 140, and a first gate capping pattern 145.

The first gate electrode 120 is formed on the first lower pattern BP1. The first gate electrode 120 crosses the first lower pattern BP1. The first gate electrode 120 surrounds the first sheet pattern NS1.

A part of the first gate electrode 120 is disposed between first sheet patterns NS1 that are adjacent to each other in the third direction D3. When the first sheet pattern NS1 includes a first upper sheet pattern and a first lower sheet pattern adjacent to each other, a part of the first gate electrode 120 is disposed between the upper surface of the first lower sheet pattern and the lower surface of the first upper sheet pattern that face each other.

The first gate electrode 120 includes at least one of a metal, a metal alloy, a conductive metal nitride, a metal silicide, a doped semiconductor material, a conductive metal oxide, or a conductive metal oxynitride. The first gate electrode 120 includes, for example, but is not necessarily limited to, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), or vanadium (V), or combinations thereof. The conductive metal oxide and the conductive metal oxynitride include, but are not necessarily limited to, an oxidized form of the above-mentioned materials.

The first gate electrode 120 is disposed on both sides of a first source/drain pattern 150 to be described below. The first gate structure GS1 is disposed on both sides of the first source/drain pattern 150 in the first direction D1.

For example, the first gate electrodes 120 on both sides of the first source/drain pattern 150 are used as the gate of the transistor. For example, the first gate electrode 120 on one side of the first source/drain pattern 150 is a gate of the transistor, but the first gate electrode 120 disposed on the other side of the first source/drain pattern 150 is a dummy gate electrode.

The first gate insulating film 130 extends along the upper surface of the field insulating film 105 and the upper surface BP1_US of the first lower pattern. The first gate insulating film 130 surrounds the first sheet pattern NS1. The first gate insulating film 130 is disposed along the periphery of the first sheet pattern NS1. The first gate electrode 120 is disposed on the first gate insulating film 130. The first gate insulating film 130 is disposed between the first gate electrode 120 and the first sheet pattern NS1.

A part of the first gate insulating film 130 is disposed between first sheet patterns NS1 that are adjacent to each other in the third direction D3. When the first sheet pattern NS1 includes the first upper sheet pattern and the first lower sheet pattern adjacent to each other, a part of the first gate insulating film 130 extends along the upper surface of the first lower sheet pattern and the lower surface of the first upper sheet pattern that face each other.

The first gate insulating film 130 includes at least one of a silicon oxide, a silicon oxynitride, a silicon nitride or a high dielectric constant material that has a higher dielectric constant than silicon oxide. The high dielectric constant material includes, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Although the first gate insulating film 130 is shown as being a single film, this is for convenience of illustration, and embodiments are not necessarily limited thereto. In an embodiment, the first gate insulating film 130 includes a plurality of films. The first gate insulating film 130 includes an interfacial layer disposed between the first sheet pattern NS1 and the first gate electrode 120, and a high dielectric constant insulating film.

The semiconductor device according to some embodiments includes an NC (Negative Capacitance) FET that uses a negative capacitor. For example, the first gate insulating film 130 includes a ferroelectric material film and a paraelectric material film.

The ferroelectric material film has a negative capacitance, and the paraelectric material film has a positive capacitance. For example, if two or more capacitors are connected in series and the capacitance of each capacitor has a positive value, the overall capacitances are lower than the capacitance of each of the individual capacitors. On the other hand, if at least one of the capacitances of two or more capacitors connected in series has a negative value, the overall capacitances is greater than an absolute value of each of the individual capacitances, while having a positive value.

When a ferroelectric material film that has a negative capacitance and a paraelectric material film that has a positive capacitance are connected in series, the overall capacitance of the ferroelectric material film and the paraelectric material film connected in series increases. By using an increased overall capacitance, a transistor that includes a ferroelectric material film has a subthreshold swing (SS) below 60 mV/decade at room temperature.

The ferroelectric material film includes, for example, at least one of hafnium oxide, hafnium zirconium oxide, barium strontium titanium oxide, barium titanium oxide, or lead zirconium titanium oxide. For example, hafnium zirconium oxide is obtained by doping hafnium oxide with zirconium (Zr). For example, hafnium zirconium oxide is a compound of hafnium (Hf), zirconium (Zr), and oxygen (O).

The ferroelectric material film further includes a dopant. For example, the dopant is at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant in the ferroelectric material film can vary, depending on which type of ferroelectric material is in the ferroelectric material film.

When the ferroelectric material film includes hafnium oxide, the dopant in the ferroelectric material film is, for example, at least one of gadolinium (Gd), silicon (Si), zirconium (Zr), aluminum (Al), or yttrium (Y).

When the dopant is aluminum (Al), the ferroelectric material film includes 3 to 8 at % (atomic %) aluminum. A ratio of the dopant is a ratio of aluminum to the sum of hafnium and aluminum.

When the dopant is silicon (Si), the ferroelectric material film includes 2 to 10 at % silicon. When the dopant is yttrium (Y), the ferroelectric material film includes 2 to 10 at % yttrium. When the dopant is gadolinium (Gd), the ferroelectric material film includes 1 to 7 at % gadolinium. When the dopant is zirconium (Zr), the ferroelectric material film includes 50 to 80 at % zirconium.

The paraelectric material film includes at least one of, for example, a silicon oxide or a metal oxide that has a high dielectric constant. The metal oxide in the paraelectric material film is, for example, but is not necessarily limited to, at least one of hafnium oxide, zirconium oxide, or aluminum oxide.

The ferroelectric material film and the paraelectric material film may include the same material. The ferroelectric material film has ferroelectric properties, but the paraelectric material film does not have ferroelectric properties. For example, when the ferroelectric material film and the paraelectric material film include hafnium oxide, a crystal structure of hafnium oxide in the ferroelectric material film differs from a crystal structure of hafnium oxide in the paraelectric material film.

The ferroelectric material film has a thickness that has the ferroelectric properties. A thickness of the ferroelectric material film is, for example, but is not necessarily limited to, 0.5 to 10 nm. Since a critical thickness that exhibits ferroelectric properties varies for each ferroelectric material, the thickness of the ferroelectric material film varies depending on the ferroelectric material.

For example, the first gate insulating film 130 includes one ferroelectric material film. For another example, the first gate insulating film 130 includes a plurality of ferroelectric material films spaced apart from each other. The first gate insulating film 130 has a stacked film structure in which the plurality of ferroelectric material films and the plurality of paraelectric material films are alternately stacked.

The first gate spacer 140 is disposed on the side walls of the first gate electrode 120. The first gate spacer 140 is not disposed between the first lower pattern BP1 and the first sheet pattern NS1, or between first sheet patterns NS1 adjacent to each other in the third direction D3.

The first gate spacer 140 includes, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), or combinations thereof. Although the first gate spacer 140 is shown as being a single layer, this is for convenience of illustration, and embodiments are not necessarily limited thereto.

The first gate capping pattern 145 is disposed on the first gate electrode 120 and the first gate spacer 140. For example, the upper surface of the first gate capping pattern 145 is an upper surface GS1_US of the first gate structure. The upper surface of the first gate capping pattern 145 is coplanar with the upper surface of the interlayer insulating film 190. In an embodiment, the first gate capping pattern 145 is disposed between the first gate spacers 140.

The first gate capping pattern 145 includes, for example, at least one of silicon nitride (SiN), silicon oxynitride (SiON), silicon carbonitride (SiCN), silicon oxycarbonitride (SiOCN), or combinations thereof. The first gate capping pattern 145 includes a material that has an etching selectivity with respect to an interlayer insulating film 190.

The first source/drain pattern 150 is disposed on the first active pattern AP1. The first source/drain pattern 150 is disposed on the first lower pattern BP1. The first source/drain pattern 150 is connected to the first sheet pattern NS1. The first source/drain pattern 150 is in contact with the first sheet pattern NS1.

The first source/drain pattern 150 is disposed on the side surfaces of the first gate structure GS1. The first source/drain pattern 150 is disposed between first gate structures GS1 adjacent to each other in the first direction D1. For example, the first source/drain pattern 150 is disposed on both sides of the first gate structure GS1. In an embodiment, the first source/drain pattern 150 is disposed on one side of the first gate structure GS1 but not on the other side of the first gate structure GS1.

The first source/drain pattern 150 is included in the source/drain of a transistor that uses the first sheet pattern NS1 as the channel region.

The first source/drain pattern 150 is disposed in a first source/drain recess 150R. The first source/drain recess 150R is formed between first gate structures GS1 adjacent to each other in the first direction D1. The first source/drain recess 150R extends in the third direction D3 into the first active pattern AP1.

A bottom surface of the first source/drain recess 150R faces the first lower pattern BP1. The side walls of the first source/drain recess 150R face the first nanosheet NS1 and the first gate structure GS1. In a cross-sectional view taken in the first direction D1, the first gate insulating film 130 of the first gate structure GS1 forms a part of the first source/drain recess 150R.

Although an upper part of the side walls of the first source/drain recess 150R is shown to have a width in the first direction D1 that decreases with increasing distance from the first lower pattern BP1, embodiments are not necessarily limited thereto.

The first gate spacer 140 is not disposed between the first gate electrode 120 between the adjacent first nanosheets NS1 and the first source/drain pattern 150. The first gate insulating film 130 is in contact with the first source/drain pattern 150.

For example, the first source/drain pattern 150 is in contact with the first gate insulating film 130 between first sheet patterns NS1 adjacent to each other in the third direction D3. The first source/drain pattern 150 is in contact with the first gate insulating film 130 between the first sheet pattern NS1 and the first lower pattern BP1.

Between the lowermost first nanosheet NS1 and the first lower pattern BP1, a boundary between the first gate insulating film 130 and the first lower pattern BP1 is the upper surface BP1_US of the first lower pattern. For example, in FIG. 2, the first gate structure GS1 includes a lowermost sub-gate structure disposed between the first lower pattern BP1 and the lowermost first nanosheet NS1. The lowermost sub-gate structure includes a part of the first gate electrode 120 and a part of the first gate insulating film 130. The upper surface BP1_US of the first lower pattern is a boundary between the lowermost sub-gate structure and the first lower pattern BP1. The bottom surface of the first source/drain recess 150R is lower than the upper surface BP1_US of the first lower pattern.

The first source/drain pattern 150 includes a semiconductor liner film 151, a semiconductor filling film 152, and a semiconductor insertion film 153. In addition, the first source/drain pattern 150 includes a capping semiconductor film that extends along an outer peripheral surface of the semiconductor filling film 152.

The semiconductor liner film 151 extends along a profile of the first source/drain recess 150R. The semiconductor liner film 151 is in contact with the first gate insulating film 130, the first sheet pattern NS1, and the first lower pattern BP1.

The semiconductor liner film 151 includes silicon germanium. The semiconductor liner film 151 is a silicon germanium liner film. The semiconductor liner film 151 includes p-type impurities. The semiconductor liner film 151 includes, for example, but is not necessarily limited to, doped boron (B).

Although the semiconductor liner film 151 is shown as a single film, embodiments are not necessarily limited thereto. The semiconductor liner film 151 includes a lower semiconductor liner film that extends along the first source/drain recess 150, and an upper semiconductor liner film on the lower semiconductor liner film. The germanium fraction of the lower semiconductor liner film differs from the germanium fraction of the upper semiconductor liner film.

The semiconductor filling film 152 is disposed on the semiconductor liner film 151. The semiconductor filling film 152 is in contact with the semiconductor liner film 151. The semiconductor filling film 152 does not contact the first gate insulating film 130.

The semiconductor filling film 152 includes a semiconductor filling film recess 152R. The semiconductor filling film recess 152R extends in the third direction D3. The semiconductor filling film recess 152R is defined by the semiconductor filling film 152.

The semiconductor filling film 152 includes silicon germanium. The semiconductor filling film 152 is a silicon germanium filling film.

The germanium fraction of the semiconductor filling film 152 differs from the germanium fraction of the semiconductor liner film 151. For example, the germanium fraction of the semiconductor filling film 152 is greater than the germanium fraction of the semiconductor liner film 151. The semiconductor filling film 152 include p-type impurities.

When the first source/drain pattern 150 does not include the capping semiconductor film, the outer peripheral surface of the semiconductor filling film 152 is the outer peripheral surface of the first source/drain pattern 150, as shown in FIG. 3.

The semiconductor insertion film 153 is disposed on the semiconductor filling film 152. The semiconductor insertion film 153 is in contact with the semiconductor filling film 152.

The semiconductor insertion film 153 extends along at least a part of the semiconductor filling film recess 152R. In an embodiment, the semiconductor insertion film 153 extends along the entire semiconductor filling film recess 152R.

In a semiconductor device according to some embodiments, the semiconductor insertion film 153 does not contact the semiconductor liner film 151. The semiconductor filling film 152 is disposed between the semiconductor insertion film 153 and the semiconductor liner film 151.

In a cross-sectional view as in FIG. 2, a part of the semiconductor filling film 152 extends along the side walls of the first source/drain recess 150R to the upper surface AP1_US of the first active pattern. In FIG. 2, the semiconductor insertion film 153 does not contact the semiconductor liner film 151.

The semiconductor insertion film 153 includes silicon germanium. The semiconductor insertion film 153 is a silicon germanium insertion film.

The germanium fraction of the semiconductor insertion film 153 differs from the germanium fraction of the semiconductor filling film 152. For example, the germanium fraction of the semiconductor insertion film 153 is greater than the germanium fraction of the semiconductor filling film 152. For another example, the germanium fraction of the semiconductor insertion film 153 is less than the germanium fraction of the semiconductor filling film 152.

The semiconductor insertion film 153 includes p-type impurities. For example, the concentration of p-type impurities of the semiconductor insertion film 153 is greater than the concentration of p-type impurities of the semiconductor filling film 152.

The first source/drain pattern 150 includes a contact recess 170R. The contact recess 170R extends in the third direction D3. At least a part of the contact recess 170R is defined by the semiconductor insertion film 153.

In a semiconductor device according to some embodiments, the entire contact recess 170R is defined by the semiconductor insertion film 153.

The source/drain etching stop film 185 is disposed on the side walls of the first gate structure GS1, the upper surface of the first source/drain pattern 150, the side walls of the first source/drain pattern 150, and the upper surface of the field insulating film 105. The source/drain etching stop film 185 includes a material that has an etching selectivity with respect to an interlayer insulating film 190 to be described below.

The source/drain etching stop film 185 includes, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), or combinations thereof. In an embodiment, the source/drain etching stop film 185 is omitted.

The source/drain etching stop film 185 is disposed on the etching stop film 185. The interlayer insulating film 190 is disposed on the first source/drain pattern 150. The interlayer insulating film 190 does not cover the upper surface GS1_US of the first gate structure. For example, the upper surface of the interlayer insulating film 190 is coplanar with the upper surface GS1_US of the first gate structure.

The interlayer insulating film 190 includes, for example, at least one of silicon oxide, silicon nitride, silicon oxynitride, or a low dielectric constant material. The low dielectric constant material includes, for example, but is not necessarily limited to, at least one of Fluorinated TetraEthylOrtho-Silicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), Hex-aMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SILK, Amorphous Fluorinated Carbon, silica aerogels, silica xerogels, mesoporous silica or combinations thereof.

The first source/drain contact 170 is disposed on the first source/drain pattern 150. The first source/drain contact 170 is connected to the first source/drain pattern 150.

The first source/drain contact 170 is disposed in the interlayer insulating film 190 and the first source/drain pattern 150. The first source/drain contact 170 penetrates the interlayer insulating film 190, but does not penetrate the first source/drain pattern 150.

The first source/drain contact 170 extends in the third direction D3. A part of the first source/drain contact 170 is disposed in the first source/drain pattern 150. The first source/drain contact 170 fills the contact recess 170R.

The first source/drain contact 170 includes a lower part 170LP and an upper part 170UP. The upper part 170UP of the first source/drain contact is disposed on the lower part 170LP of the first source/drain contact.

The lower part 170LP of the first source/drain contact is disposed in the first source/drain pattern 150. The lower part 170LP of the first source/drain contact fills the contact recess 170R. The lower part 170LP of the first source/drain contact is surrounded by the first source/drain pattern 150.

In a semiconductor device according to some embodiments, the semiconductor insertion film 153 surrounds the lower part 170LP of the first source/drain contact. The semiconductor insertion film 153 extends along side walls 170LP_SW of the lower part 170LP of the first source/drain contact and a bottom surface 170LP_BS of the lower part 170LP of the first source/drain contact.

In FIG. 5, at the boundary between the lower part 170LP of the first source/drain contact and the upper part 170UP of the first source/drain contact, the width of the lower part 170LP of the first source/drain contact is the same as the width of the upper part 170UP of the first source/drain contact.

Although the slope of the side walls of the first source/drain contact 170 is shown as changing at the boundary between the lower part 170LP of the first source/drain contact and the upper part 170UP of the first source/drain contact, embodiments are not necessarily limited thereto.

The upper surface 170US of the first source/drain contact is coplanar with the upper surface GS1_US of the first gate structure. The upper surface 170US of the first source/drain contact is coplanar with the upper surface of the interlayer insulating film 190.

The first source/drain contact 170 includes a first source/drain barrier film 171 and a first source/drain filling film 172. The first source/drain filling film 172 is disposed on the first source/drain barrier film 171.

The first source/drain barrier film 171 includes, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material. In a semiconductor device according to some embodiments, the two-dimensional material is a metal and/or a semiconductor. The 2D material includes one of a 2D allotrope or a 2D compound, and may include, but is not necessarily limited to, at least one of graphene, molybdenum disulfide ($MoS_2$), molybdenum diselenide ($MoSe_2$), tungsten diselenide ($WSe_2$), or tungsten disulfide ($WS_2$).

The first source/drain filling film 172 includes, for example, at least one of aluminum (Al), tungsten (W), cobalt (Co), copper (Cu), ruthenium (Ru), silver (Ag), gold (Au), manganese (Mn), or molybdenum (Mo).

In an embodiment, the first source/drain contact 170 is formed of a single film.

A first contact silicide film 155 is disposed between the first source/drain contact 170 and the first source/drain pattern 150. The first source/drain contact 170 is disposed on the first contact silicide film 155.

The first contact silicide film 155 extends along the profile of the contact recess 170R. The first contact silicide film 155 is in contact with the first source/drain contact 170 and the first source/drain pattern 150.

The first contact silicide film 155 is disposed along the profile of the lower part 170LP of the first source/drain contact. The first contact silicide film 155 extends along the side walls 170LP_SW of the lower part 170LP of the first source/drain contact and the bottom surface 170LP_BS of the lower part 170LP of the first source/drain contact.

For example, since the entire contact recess 170R is defined by the semiconductor insertion film 153, the entire first contact silicide film 155 is in contact with the semiconductor insertion film 153. The first contact silicide film 155 does not contact the semiconductor filling film 152.

The first contact silicide film 155 includes a metal silicide. For example, the first contact silicide film 15S includes a metal silicide that includes a metal included in the first source/drain barrier film 171. For another example, the first contact silicide film 155 includes a metal silicide that includes a metal that is not included in the first source/drain barrier film 171.

Figure 6:
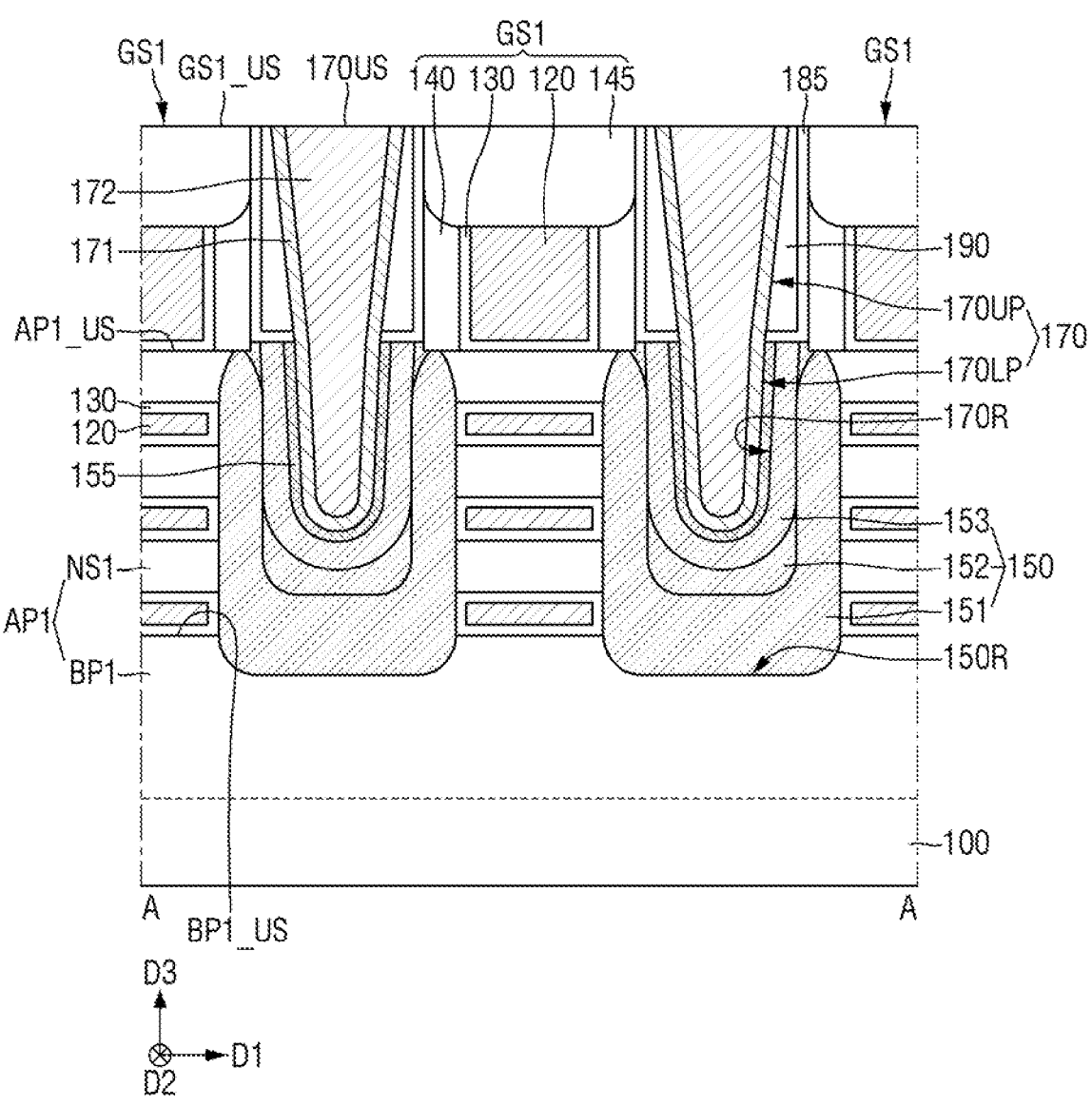
FIG. 6 is a cross-sectional view of a semiconductor device according to some embodiments.

FIG. 6 is a cross-sectional view of a semiconductor device according to some embodiments, taken along line A-A' of FIG. 1. For convenience of description, differences from embodiments described with reference to FIGS. 1 to 5 will be mainly described.

Referring to FIG. 6, in a semiconductor device according to some embodiments, the semiconductor insertion film 153 is in contact with the semiconductor liner film 151.

In a cross-sectional view taken in the first direction D1, the semiconductor filling film 152 does not extend along the side walls of the first source/drain recess 150R to the upper surface AP1_US of the first active pattern.

Figure 7:
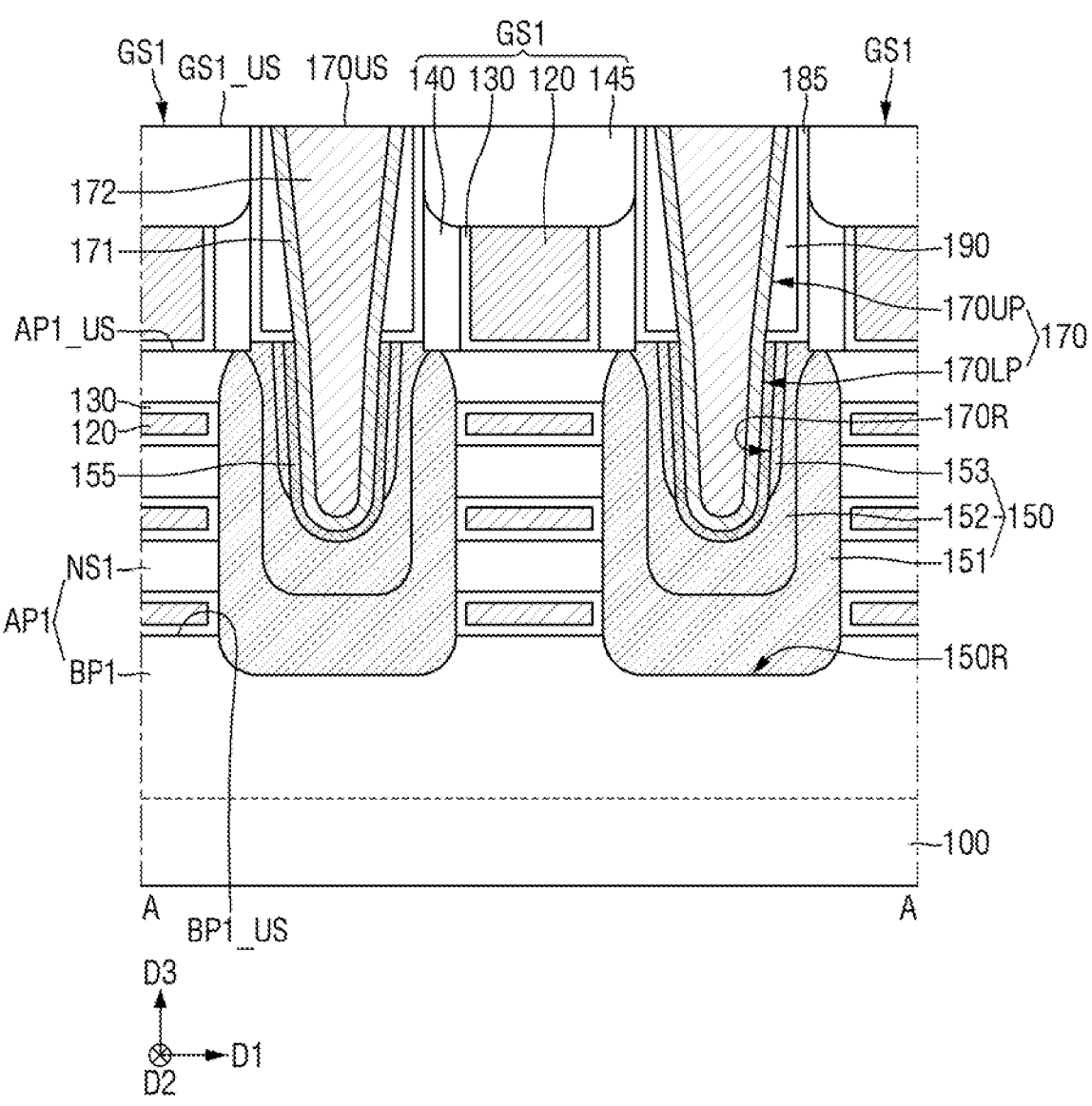
FIGS. 7 and 8 are cross-sectional views of a semiconductor device according to some embodiments.
Figure 8:
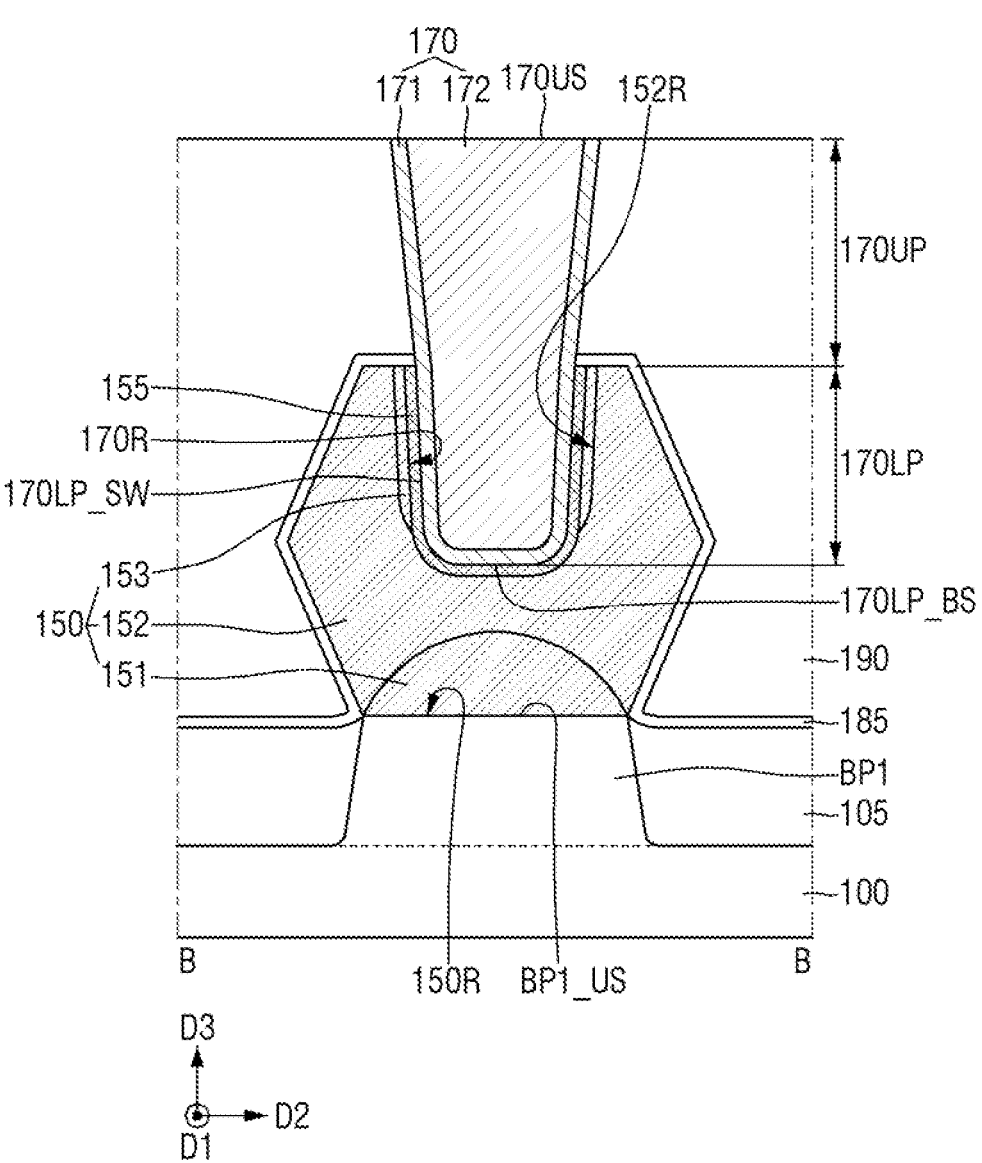
Figure 9:
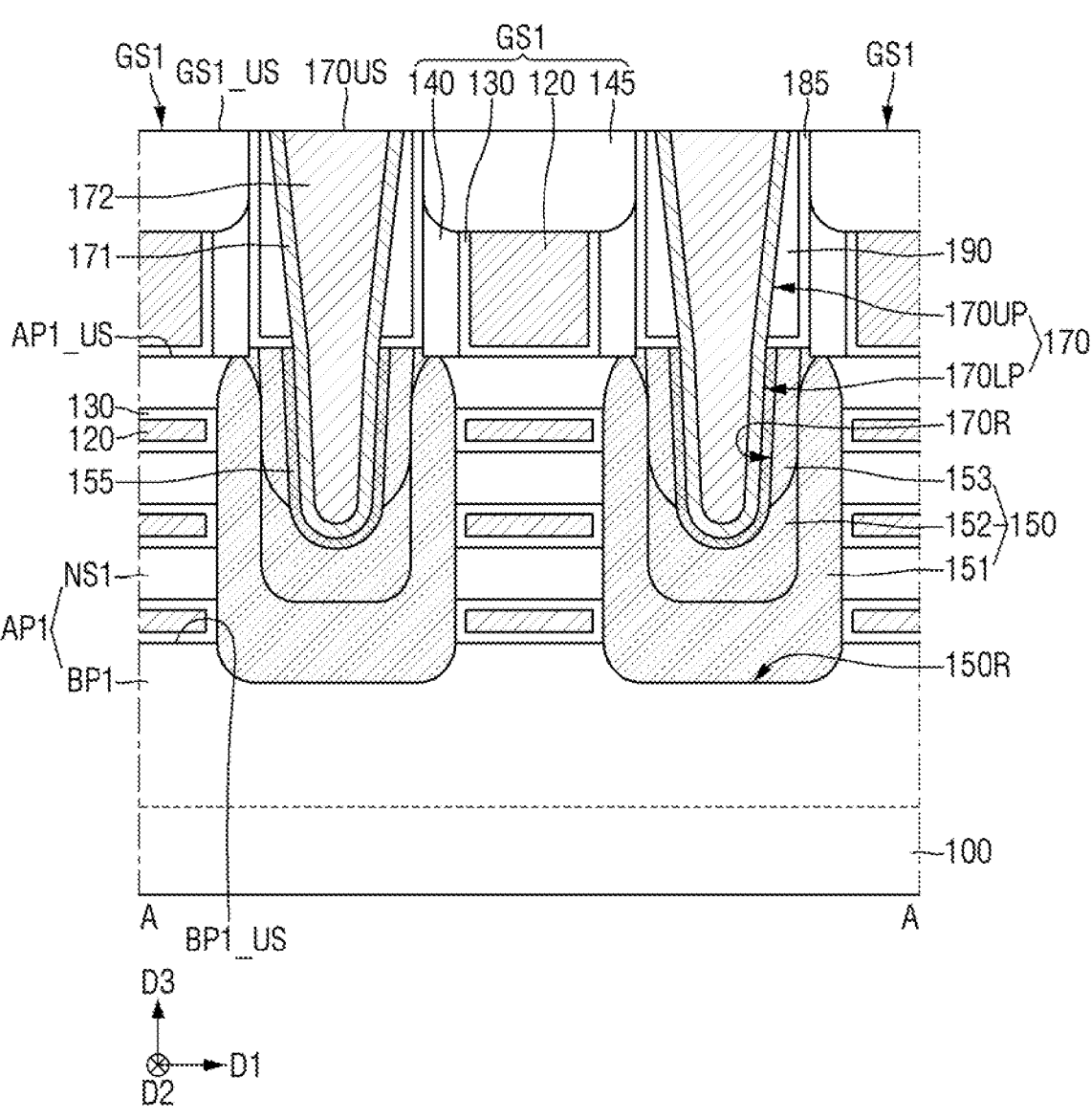
FIG. 9 is a cross-sectional view of a semiconductor device according to some embodiments.

FIGS. 7 and 8 are cross-sectional views of a semiconductor device according to some embodiments, taken along lines A-A' and B—B' of FIG. 1, respectively. FIG. 9 is a cross-sectional view of a semiconductor device according to some embodiments, taken along line A-A' of FIG. 1. For convenience of description, differences from embodiments described with reference to FIGS. 1 to 5 will be mainly described.

Referring to FIGS. 7 to 9, in a semiconductor device according to some embodiments, the first contact silicide film 155 is in contact with the semiconductor filling film 152.

The contact recess 170R is defined by the semiconductor insertion film 153 and the semiconductor filling film 152. At least a part of the side walls of the contact recess 170R is defined by the semiconductor insertion film 153, and the bottom portion of the contact recess 170R is defined by the semiconductor filling film 152. The first contact silicide film 155 is in contact with the semiconductor filling film 152 and the semiconductor insertion film 153.

The semiconductor insertion film 153 extends along a part of the semiconductor filling film recess 152R. The semiconductor insertion film 153 is not disposed along the bottom surface of the lower part 170LP of the first source/drain contact.

In FIG. 7, the semiconductor insertion film 153 does not contact the semiconductor liner film 151.

In FIG. 9, the semiconductor insertion film 153 is in contact with the semiconductor liner film 151.

Figure 10:
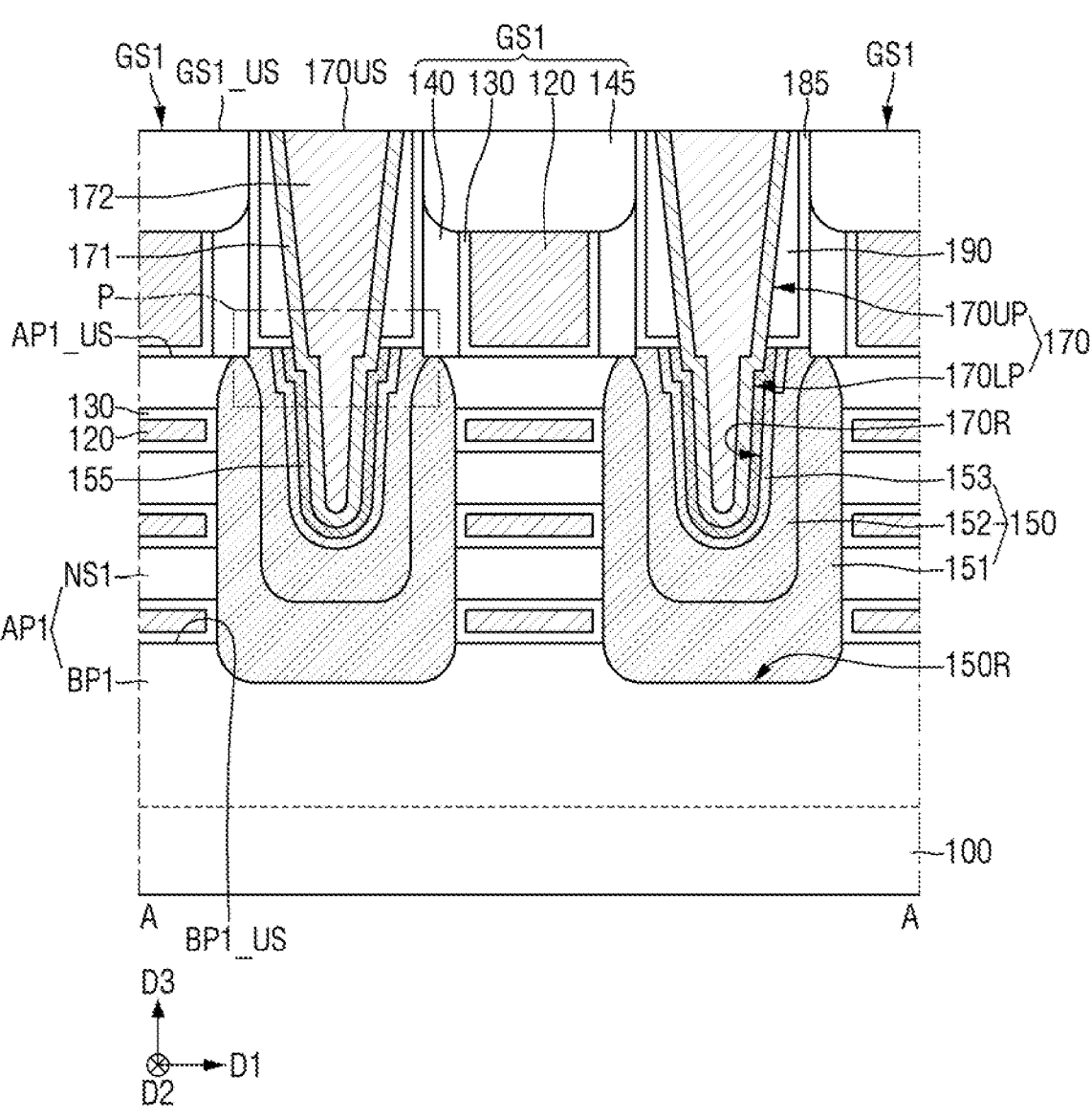
FIGS. 10 to 12 are cross-sectional views of a semiconductor device according to some embodiments.
Figure 11:
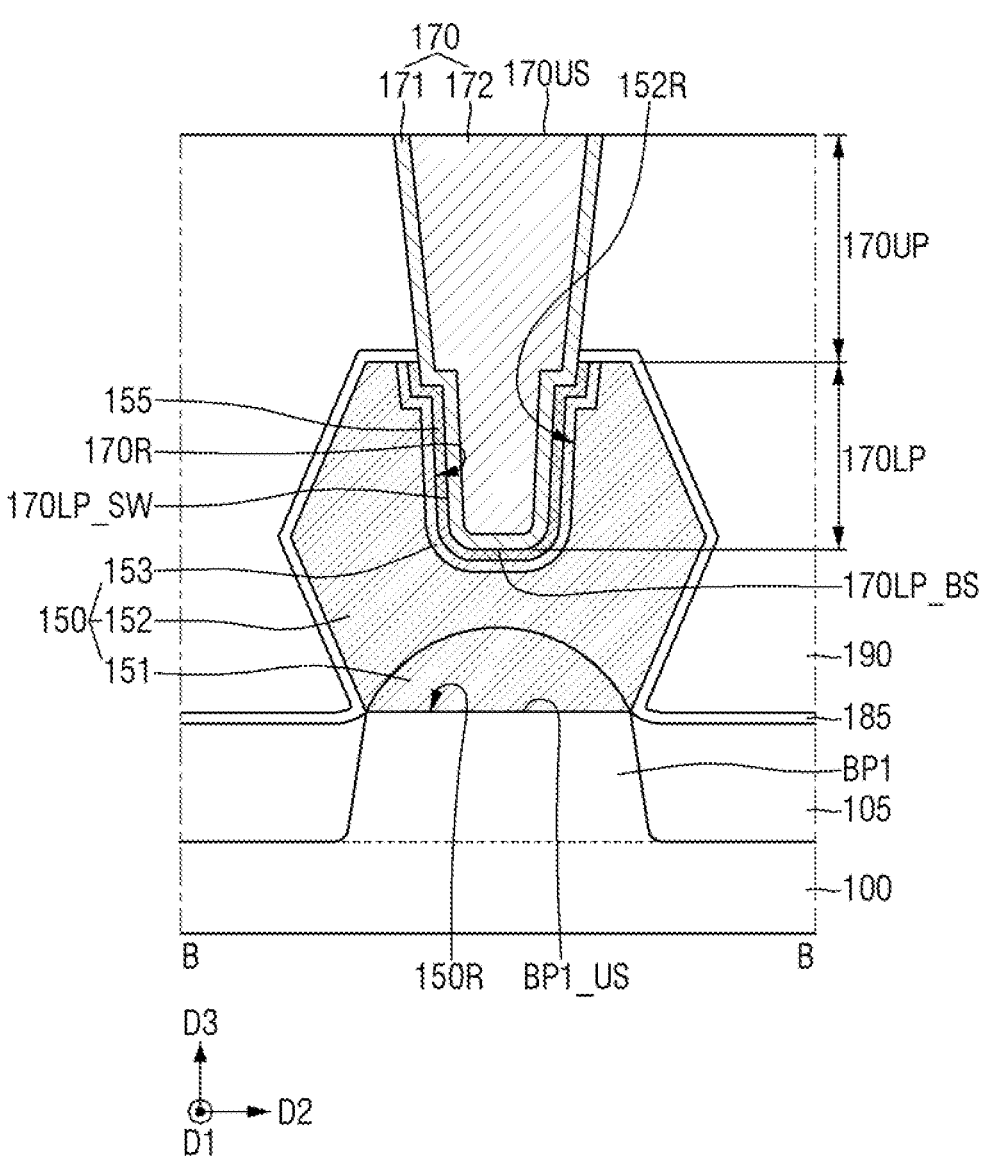
Figure 12:
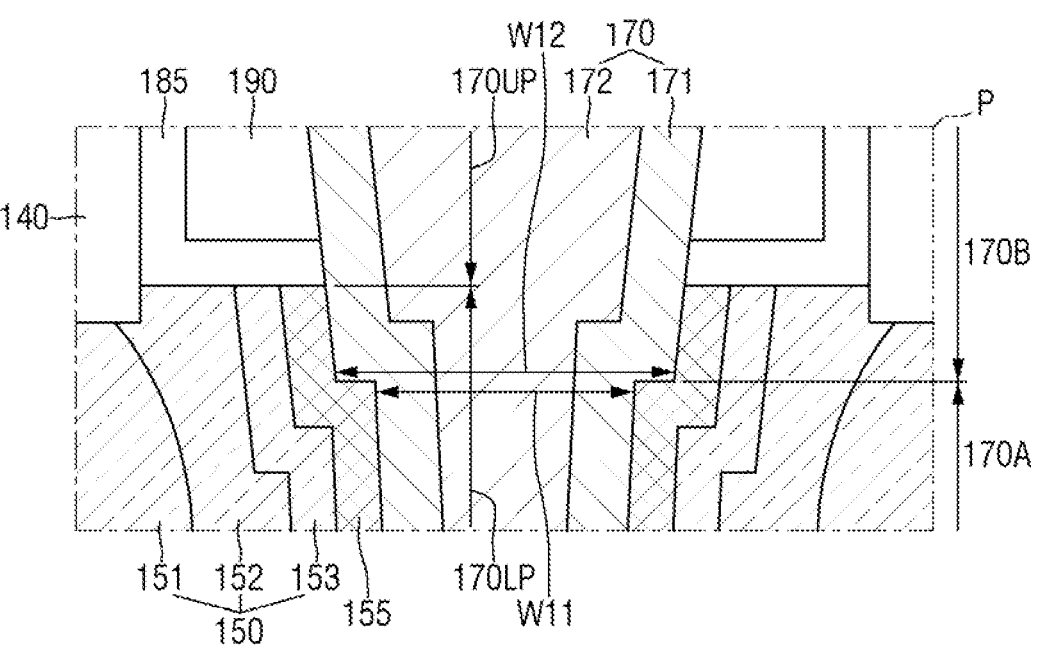

FIGS. 10 to 12 are cross-sectional views of a semiconductor device according to some embodiments, taken along lines A-A' and B—B' of FIG. 1 and of portion P of FIG. 10, respectively. For convenience of description, differences from embodiments described with reference to FIGS. 1 to 5 will be mainly described.

Referring to FIGS. 10 to 12, in a semiconductor device according to some embodiments, the first source/drain contact 170 includes a first portion 170A and a second portion 170B.

At a boundary between the first portion 170A of the first source/drain contact and the second portion 170B of the first source/drain contact, the width of the first source/drain contact 170 changes discontinuously.

For example, at the boundary between the first portion 170A of the first source/drain contact and the second portion 170B of the first source/drain contact, a width W11 of the first portion 170A of the first source/drain contact is less than a width W12 of the second portion 170B of the first source/drain contact.

Although the lower part 170LP of the first source/drain contact is shown as including the first portion 170A of the first source/drain contact, and a part of the second portion 170B of the first source/drain contact, embodiments are not necessarily limited thereto.

In an embodiment, the upper part 170UP of the first source/drain contact includes a part of the first portion 170A of the first source/drain contact, and the second portion 170B of the first source/drain contact. In an embodiment, the upper part 170UP of the first source/drain contact includes only the second portion 170B of the first source/drain contact, and the lower part 170LP of the first source/drain contact includes only the first portion 170A of the first source/drain contact.

Figure 13:
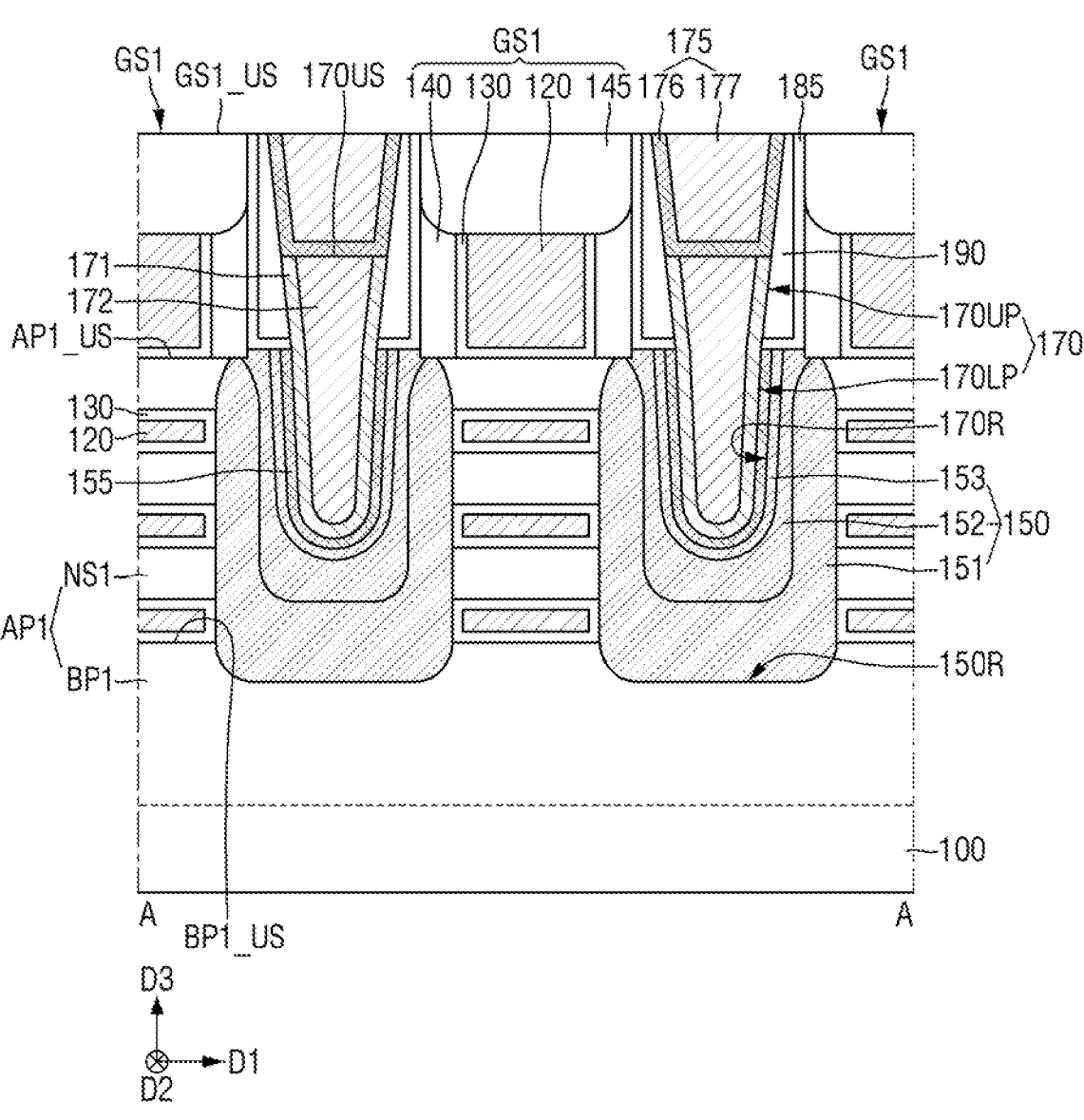
FIGS. 13 and 14 are cross-sectional views of a semiconductor device according to some embodiments.
Figure 14:
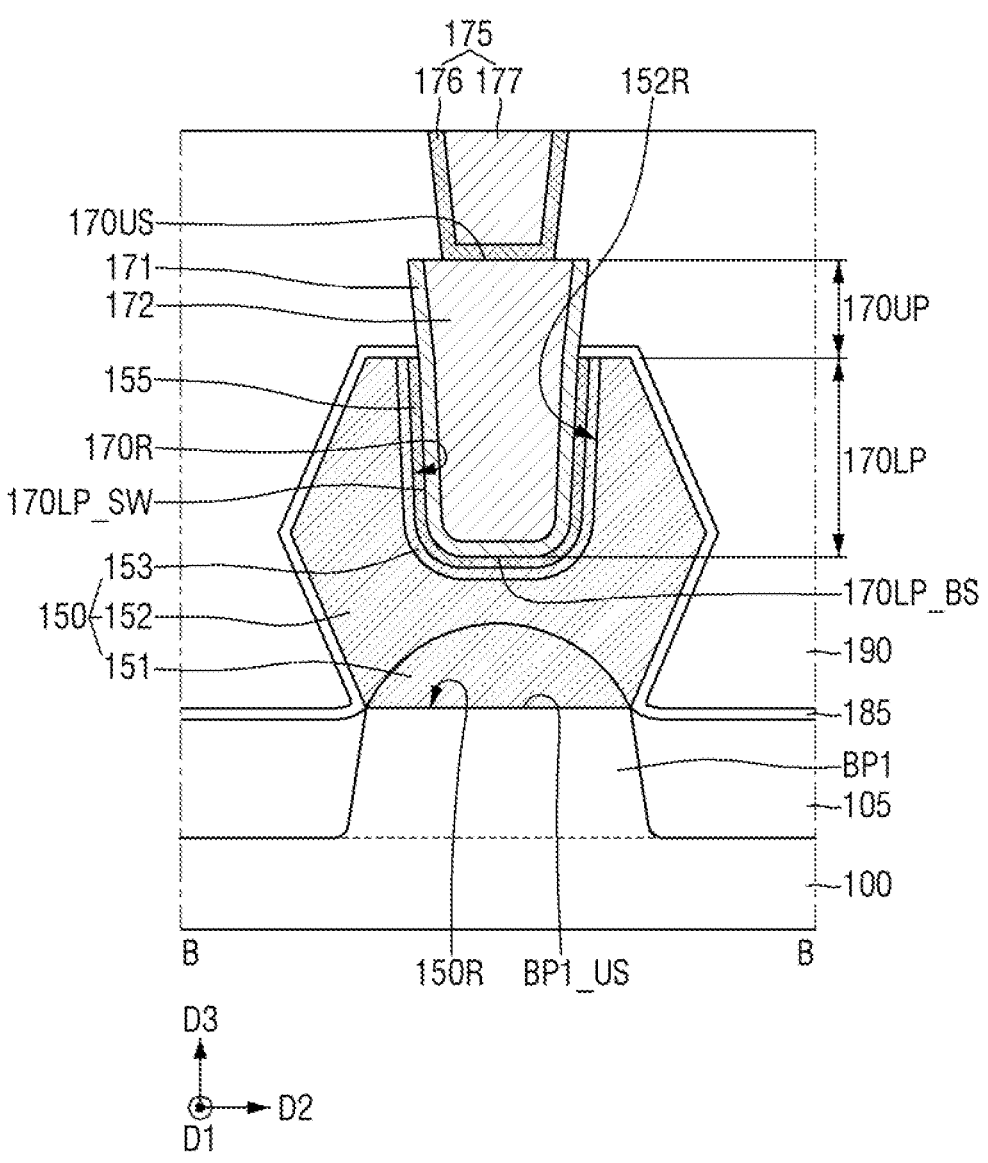

FIGS. 13 and 14 are cross-sectional views of a semiconductor device according to some embodiments, taken along lines A-A' and B—B' of FIG. 1, respectively. For convenience of description, differences from embodiments described with reference to FIGS. 1 to 5 will be mainly described.

Referring to FIGS. 13 and 14, a semiconductor device according to some embodiments further includes a connecting via pattern 175 disposed on the first source/drain contact 170.

A connecting via pattern 175 connects the first source/drain contact 170 to the wiring formed in a BEOL (Back End Of Line) process.

An upper surface of the connecting via pattern 175 is coplanar with the upper surface GS1_US of the first gate structure. The upper surface 170US of the first source/drain contact is lower than the upper surface GS1_US of the first gate structure, and higher than the upper surface AP1_US of the first active pattern.

The connecting via pattern 175 includes a connecting via barrier film 176 and a connecting via filling film 177. The connecting via filling film 177 is disposed on the connecting via barrier film 176.

The connecting via barrier film 176 includes, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) or a two-dimensional (2D) material. The connecting via filling film 177 includes, for example, at least one of aluminum (AI), tungsten (W), cobalt (Co), copper (Cu), ruthenium (Ru), silver (Ag), gold (Au), manganese (Mn), or molybdenum (Mo).

In an embodiment, the connecting via pattern 175 is formed of a single filmi.

Figure 15:
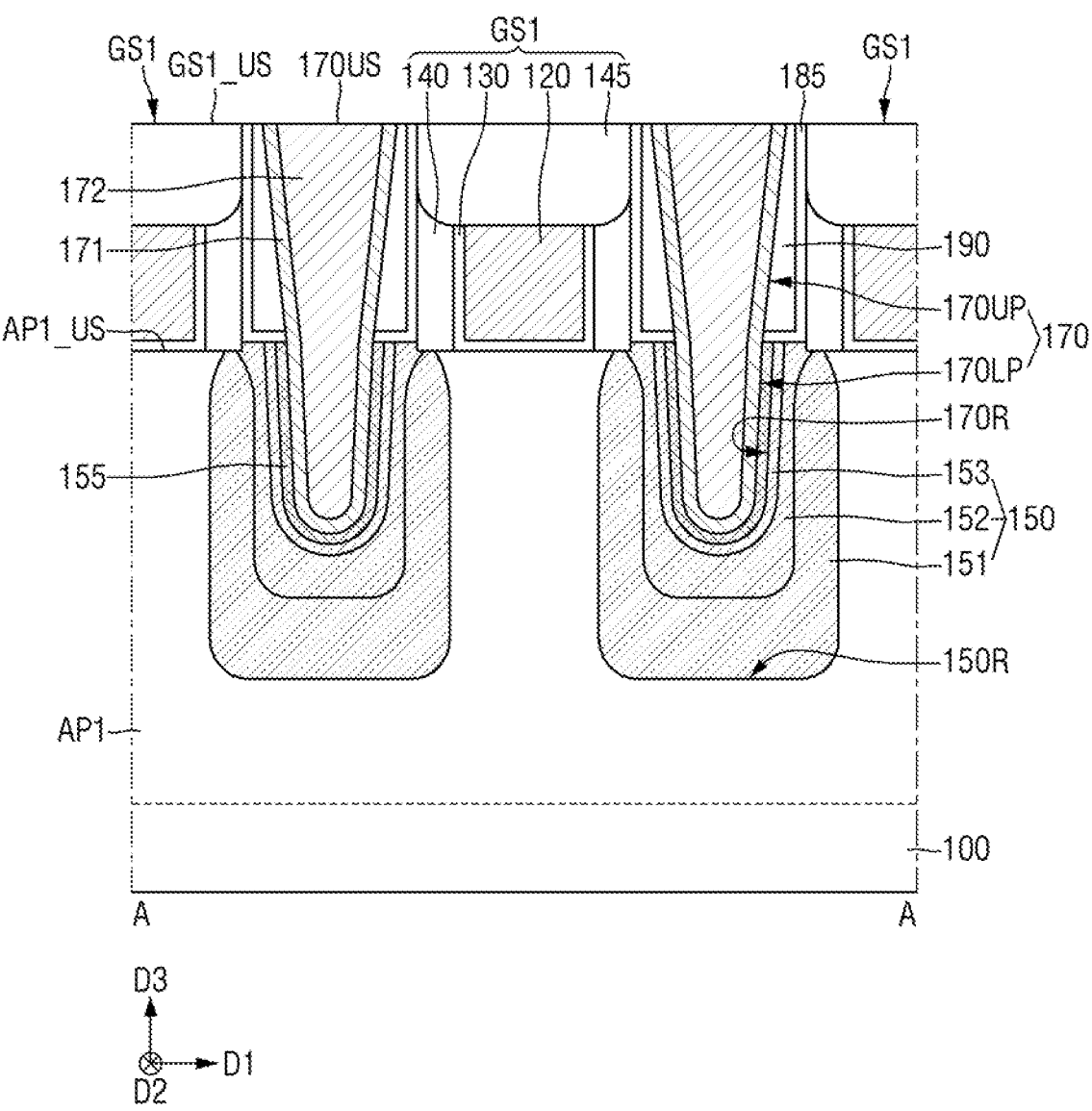
FIGS. 15 and 16 are cross-sectional views of a semiconductor device according to some embodiments.
Figure 16:
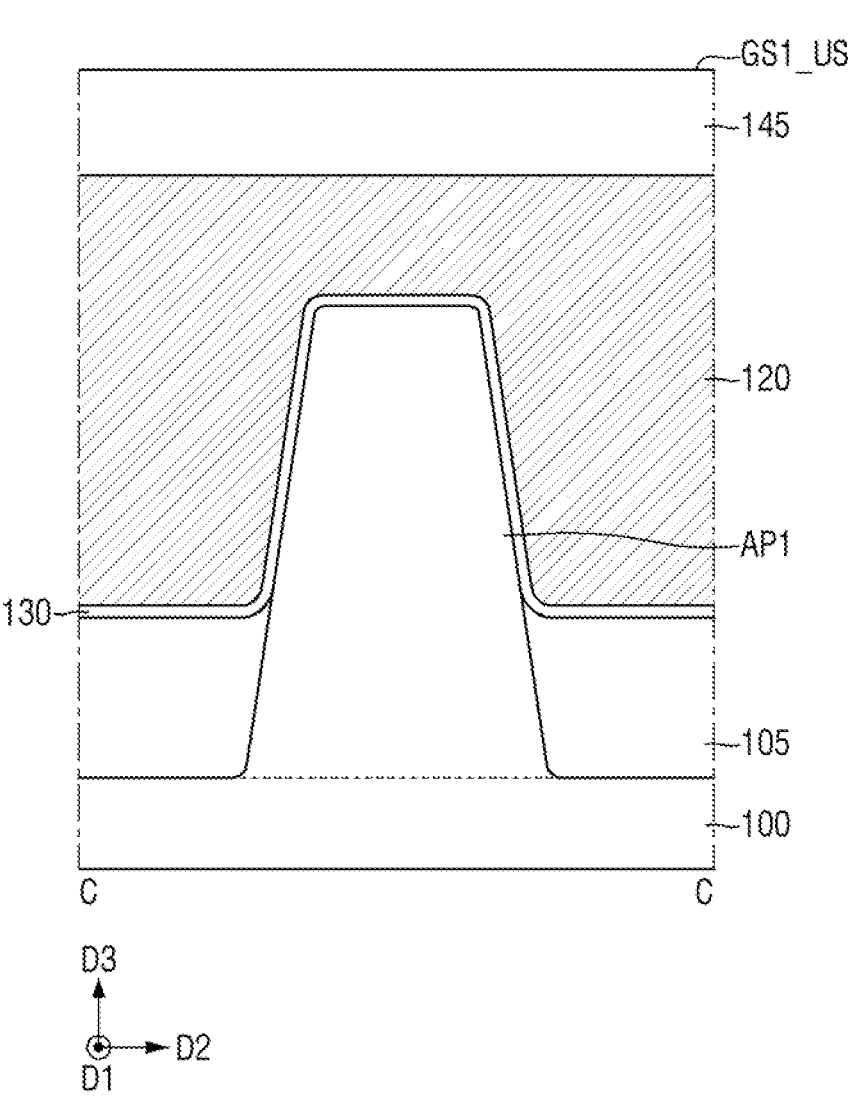

FIGS. 15 and 16 are cross-sectional views of a semiconductor device according to some embodiments, taken along lines A-A' and C-C' of FIG. 1, respectively. For convenience of description, differences from embodiments described with reference to FIGS. 1 to 5 will be mainly described.

Referring to FIGS. 15 and 16, in a semiconductor device according to some embodiments, the first active pattern AP1 does not include the first sheet pattern (NS1 of FIG. 2).

The first active pattern AP1 is a fin type pattern. The first active pattern AP1 is used as a channel region of a transistor that includes the first gate electrode 120.

Figure 17:
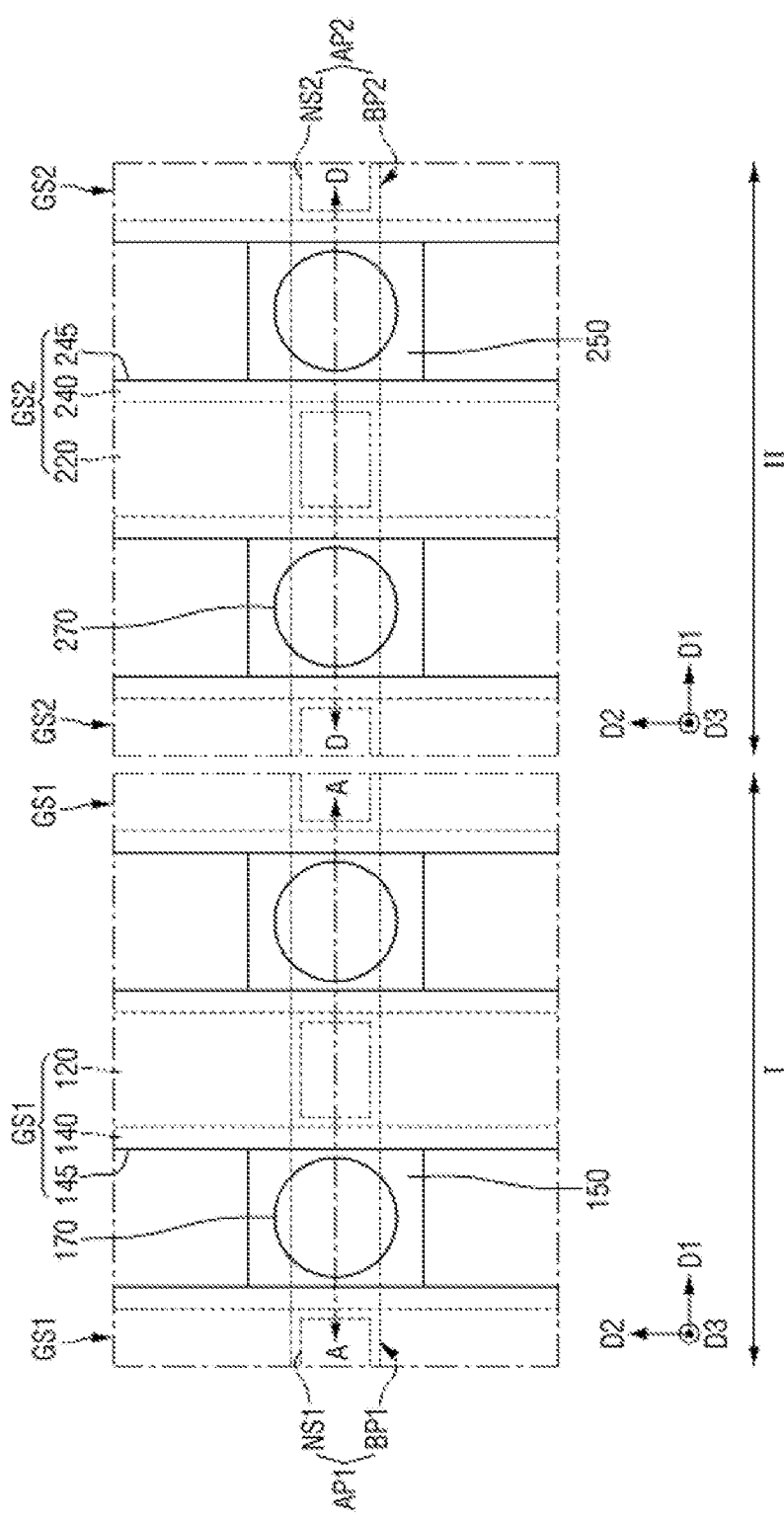
FIG. 17 is a plan view of a semiconductor device according to some embodiments.
Figure 18:
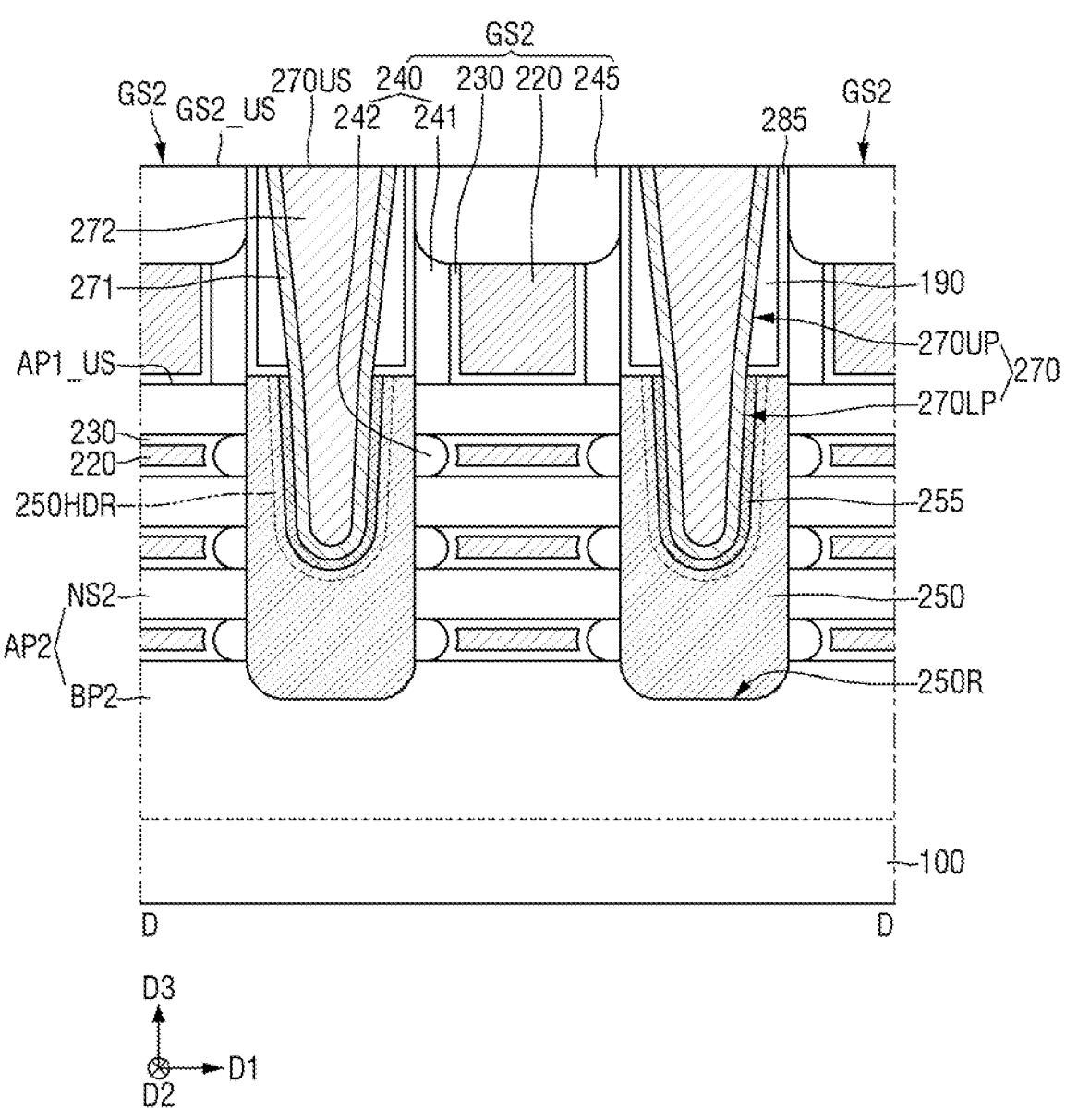
FIGS. 18 and 19 are cross-sectional views taken along line D-D of FIG. 17, respectively.
Figure 19:
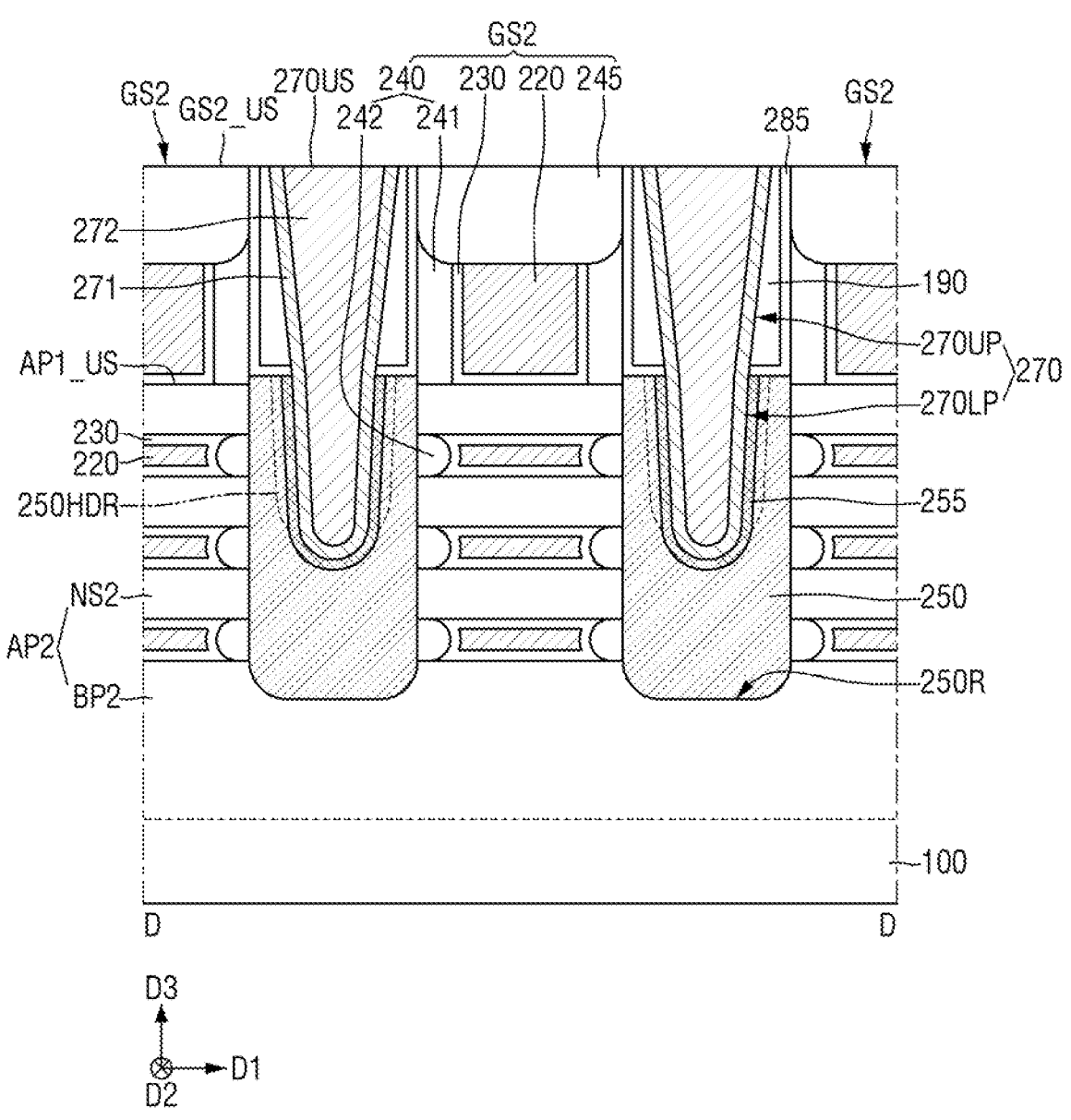

FIG. 17 is a plan view of a semiconductor device according to some embodiments. FIGS. 18 and 19 are cross-sectional views taken along D-D of FIG. 17, respectively.

For reference, the cross-sectional view taken along A-A of FIG. 17 is the same as one of FIGS. 2, 6, 7, 9, 10 and 13. In addition, the description of the first region I of FIG. 17 is substantially the same as that described with reference to FIGS. 1 to 14. Therefore, the following description will focus on the second region II of FIG. 17.

Referring to FIGS. 17 to 19, a semiconductor device according to some embodiments includes a first active pattern AP1, a plurality of first gate structures GS1, a first source/drain pattern 150, a first source/drain contact 170, a second active pattern AP2, a plurality of second gate structures GS2, a second source/drain pattern 250, and a second source/drain contact 270.

The substrate 100 includes a first region I and a second region II. The first region I is where a PMOS is formed, and the second region II is where an NMOS is formed.

The first active pattern AP1, the plurality of first gate structures GS1, the first source/drain pattern 150, and the first source/drain contact 170 are disposed in the first region I of the substrate 100. The second active pattern AP2, the plurality of second gate structures GS2, the second source/ drain pattern 250, and the second source/drain contact 270 are disposed in the second region II of the substrate 100.

The second active pattern AP2 includes a second lower pattern BP2 and a plurality of second sheet patterns NS2. The second lower pattern BP2 protrudes from the substrate 100 in the third direction D3. The second lower pattern BP2 extends along the first direction D1. A plurality of second sheet patterns NS2 are disposed on the second lower pattern BP2. The plurality of second sheet patterns NS2 are spaced apart from the second lower pattern BP2 in the third direction D3.

Each of the second lower pattern BP2 and the second sheet pattern NS2 includes one of silicon or germanium, a group IV-IV compound semiconductor or a group III-V compound semiconductor. In a semiconductor device according to some embodiments, the second lower pattern BP2 is a silicon lower pattern that includes silicon, and the second sheet pattern NS2 is a silicon sheet pattern that includes silicon.

A plurality of second gate structures GS2 are disposed on the substrate 100. Each second gate structure GS2 extends in the second direction D2. Adjacent second gate structures GS2 are spaced apart from each other in the first direction D1.

The second gate structure GS2 is disposed on the second active pattern AP2. The second gate structure GS2 crosses the second active pattern AP2. The second gate structure GS2 crosses the second lower pattern BP2. The second gate structure GS2 surrounds each second sheet pattern NS2.

The second gate structure GS2 includes, for example, a second gate electrode 220, a second gate insulating film 230, a second gate spacer 240, and a second gate capping pattern 245.

In FIGS. 18 and 19, the second gate spacer 240 includes an outer spacer 241 and an inner spacer 242, unlike the first gate spacer 140. The inner spacer 242 is disposed between second sheet patterns NS2 that are adjacent to each other in the third direction D3. The inner spacer 242 is in contact with the second gate insulating film 230. The inner spacer 242 defines a part of the second source/drain recess 250R.

In an embodiment, the second gate spacer 240 does not include an inner spacer, like the first gate spacer 140. That is, the second gate insulating film 230 is in contact with the second source/drain pattern 250.

The upper surface of the second gate capping pattern 245 is the upper surface GS2_US of the second gate structure. The upper surface of the second gate capping pattern 245 is coplanar with the upper surface of the interlayer insulating film 190.

Since the second gate electrode 220, the second gate insulating film 230, the second gate spacer 240, and the second gate capping pattern 245 are substantially the same as the first gate electrode 120, the first gate insulating film 130, the first gate spacer 140, and the first gate capping pattern 145, a repeated description thereof will be omitted below.

The second source/drain pattern 250 is formed on the second active pattern AP2. The second source/drain pattern 250 is formed on the second lower pattern BP2. The second source/drain pattern 250 is connected to the second sheet pattern NS2. The second source/drain pattern 250 is in contact with the second sheet pattern NS2.

The second source/drain pattern 250 is disposed on the side surface of the second gate structure GS2. The second source/drain pattern 250 is disposed between second gate structures GS2 that are adjacent to each other in the first direction D1. For example, the second source/drain pattern 250 is disposed on both sides of the second gate structure GS2. In an embodiment, the second source/drain pattern 250 is disposed on one side of the second gate structure GS2 and but not on the other side of the second gate structure GS2.

The second source/drain pattern 250 is a source/drain of a transistor that uses the second sheet pattern NS2 as a channel region.

The second source/drain pattern 250 is disposed in the second source/drain recess 250R. The second source/drain recess 250R is defined between second gate structures GS2 that are adjacent to each other in the first direction D1. The bottom surface of the second source/drain recess 250R is defined by the second lower pattern BP2. The side walls of the second source/drain recess 250R are defined by the second nanosheet NS2 and the second gate structure GS2.

The second source/drain pattern 250 includes silicon doped with n-type impurities. The n-type impurities are, for example, but are not necessarily limited to, phosphorus (P) or arsenic (As).

The second source/drain pattern 250 includes a high concentration impurity region 250HDR. The high concentration impurity region 250HDR is in contact with a second contact silicide film 255 to be described below. The concentration of n-type impurities of the high concentration impurity region 250HDR is higher than the concentration of n-type impurities of the second source/drain pattern 250 disposed around the high concentration impurity region 250HDR.

The second source/drain contact 270 is disposed on the second source/drain pattern 250. The second source/drain contact 270 is connected to the second source/drain pattern 250. The second source/drain contact 270 is disposed in the interlayer insulating film 190 and the second source/drain pattern 250.

The second source/drain contact 270 includes a lower part 270LP and an upper part 270UP. The upper part 270UP of the second source/drain contact is disposed on the lower part 270LP of the second source/drain contact. The lower part 270LP of the second source/drain contact is disposed in the second source/drain pattern 250. The lower part 270LP of the second source/drain contact is surrounded by the second source/drain pattern 250.

An upper surface 270US of the second source/drain contact is coplanar with the upper surface GS2_US of the second gate structure. The upper surface 270US of the second source/drain contact is coplanar with the upper surface of the interlayer insulating film 190.

The second contact silicide film 255 is disposed between the second source/drain contact 270 and the second source/drain pattern 250. The second source/drain contact 270 is disposed on the second contact silicide film 255. The second contact silicide film 255 is in contact with the second source/drain contact 270 and the second source/drain pattern 250.

The second contact silicide film 255 is disposed along the profile of the lower part 270LP of the second source/drain contact. The second contact silicide film 255 extends along the side walls of the lower part 270LP of the second source/drain contact and the bottom surface of the lower part 270LP of the second source/drain contact.

FIG. 18 shows that the high concentration impurity region 250HDR surrounds the lower part 270LP of the second source/drain contact. The high concentration impurity region 250HDR extends along the side walls of the lower part 270LP of the second source/drain contact and the bottom surface of the lower part 270LP of the second source/drain contact. The entire second contact silicide film 255 is in contact with the high concentration impurity region 250HDR.

FIG. 19 shows that the high concentration impurity region 250HDR is disposed along at least a part of the side walls of the lower part 270LP of the second source/drain contact. The high concentration impurity region 250HDR is not disposed along the bottom surface of the lower part 270LP of the second source/drain contact. A part of the second contact silicide film 255 does not contact the high concentration impurity region 250HDR.

The second source/drain contact 270 includes a second source/drain barrier film 271 and a second source/drain filling film 272. The second source/drain filling film 272 is disposed on the second source/drain barrier film 271. The materials included in the second source/drain barrier filmi 271 and the second source/drain filling film 272 are the same as those of the first source/drain barrier film 171 and the first source/drain filling film 172.

The second contact silicide film 255 includes a metal silicide. For example, the second contact silicide film 255 includes a metal silicide that includes a metal that is included in the second source/drain barrier film 271. For another example, the second contact silicide film 255 includes a metal silicide that includes a metal that is not included in the second source/drain barrier film 271.

FIGS. 20 to 28 illustrate a method for fabricating a semiconductor device according to some embodiments. For reference, FIGS. 20 to 28 are cross-sectional views taken along A-A of FIG. 1.

FIGS. 20 to 28 show a process of forming the first source/drain contact 170. However, the description of FIGS. 20 to 28 may apply to a process of forming the second source/drain contact 270.

Figure 20:
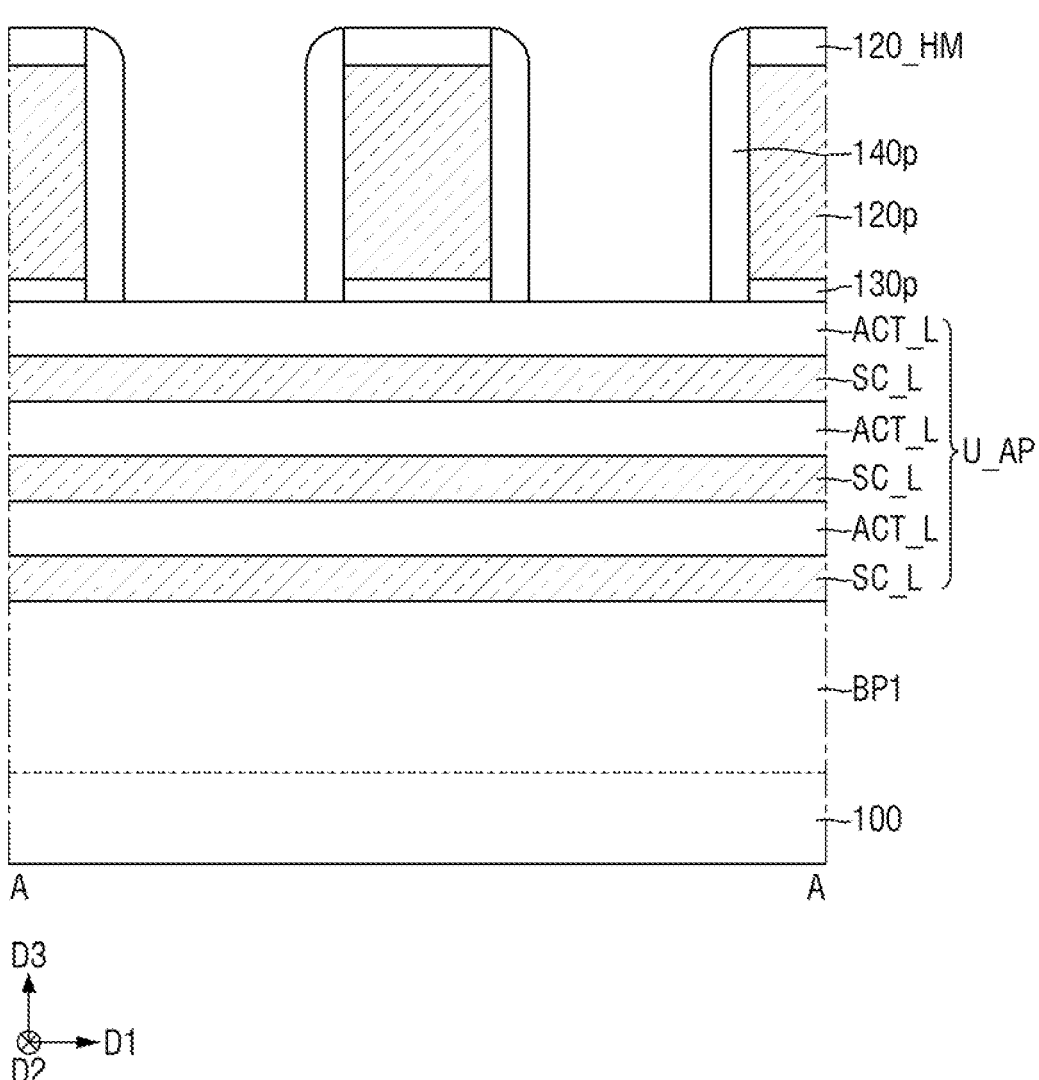

Referring to FIG. 20, in an embodiment, the first lower pattern BP1 and an upper pattern structure U_AP that extend along the first direction D1 are formed.

The upper pattern structure U_AP is disposed on the first lower pattern BP1. The upper pattern structure U_AP includes a sacrificial pattern SC_L and an active pattern ACT_L that are alternately stacked on the first lower pattern BP1.

For example, the sacrificial pattern SC_L includes a silicon-germanium film, and the active pattern ACT_L includes a silicon film.

A dummy gate insulating film 130p, a dummy gate electrode 120p, and a dummy gate capping film 120_HM are formed on the upper pattern structure U_AP. The dummy gate insulating film 130p includes, for example, but is not necessarily limited to, silicon oxide. The dummy gate electrode 120p includes, for example, but is not necessarily limited to, polysilicon. The dummy gate capping film 120_HM includes, for example, but is not necessarily limited to, silicon nitride.

A pre-gate spacer 140p is formed on the side walls of the dummy gate insulating film 130p, the side walls of the dummy gate electrode 120p, and the side walls of the dummy gate capping film 120_HM.

The pre-gate spacer 140p extends along the second direction D2.

Figure 21:
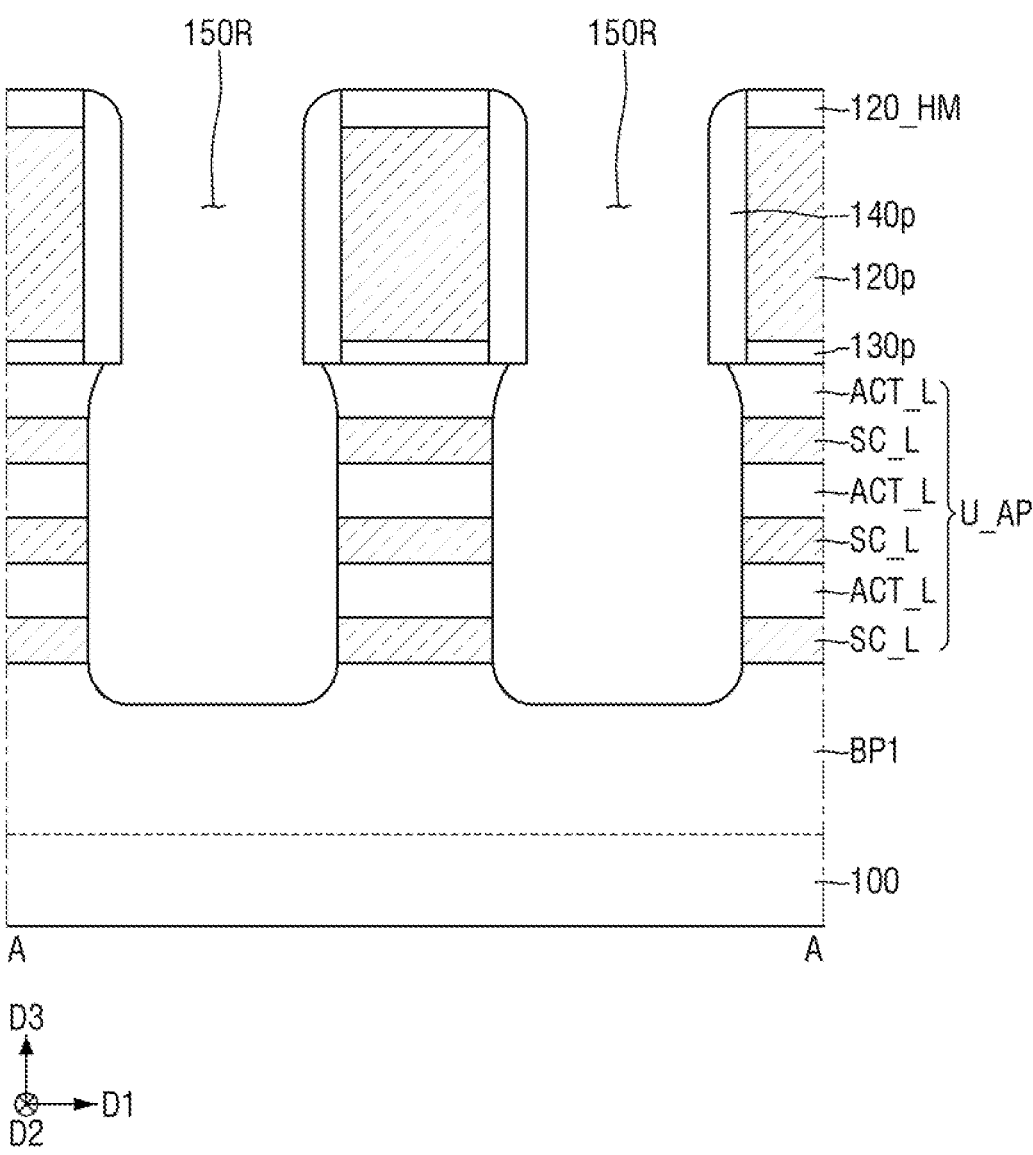

Referring to FIG. 21, in an embodiment, the first source/drain recess 150R is formed in the upper pattern structure U_AP, by using the dummy gate electrode 120p and the pre-gate spacer 140p as masks.

The first source/drain recess 150R is undercut into the lower part of the pre-gate spacer 140p, but embodiments are not necessarily limited thereto.

A part of the first source/drain recess 150R is formed in the first lower pattern BP1.

Figure 22:
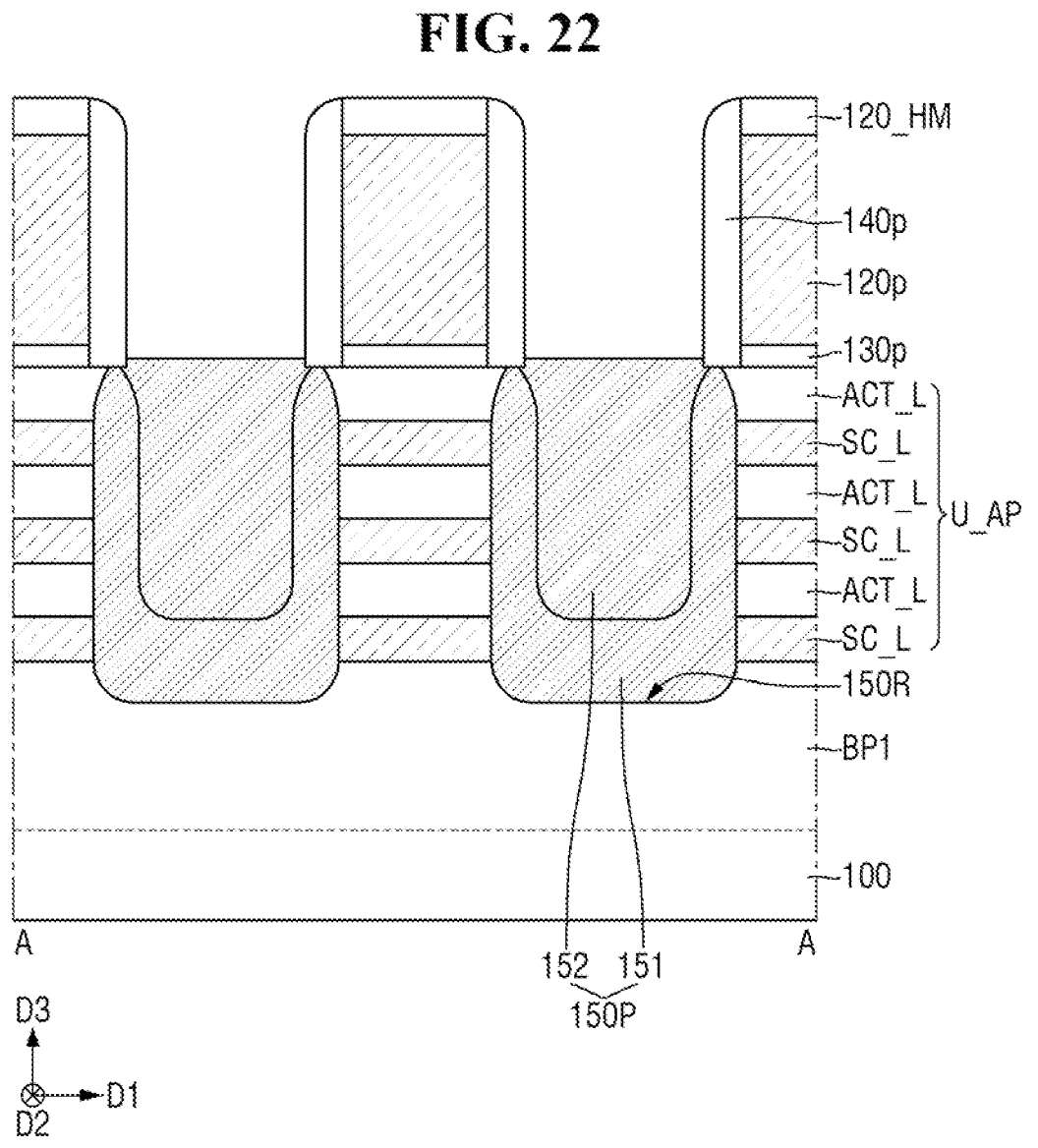

Referring to FIG. 22, in an embodiment, a first pre-source/drain pattern 150P is formed in the first source/drain recess 150R.

The first pre-source/drain pattern 150P includes a semiconductor liner film 151 and a semiconductor filling film 152. The semiconductor liner film 151 and the semiconductor filling film 152 are each formed, for example, using an epitaxial growth method.

Figure 23:
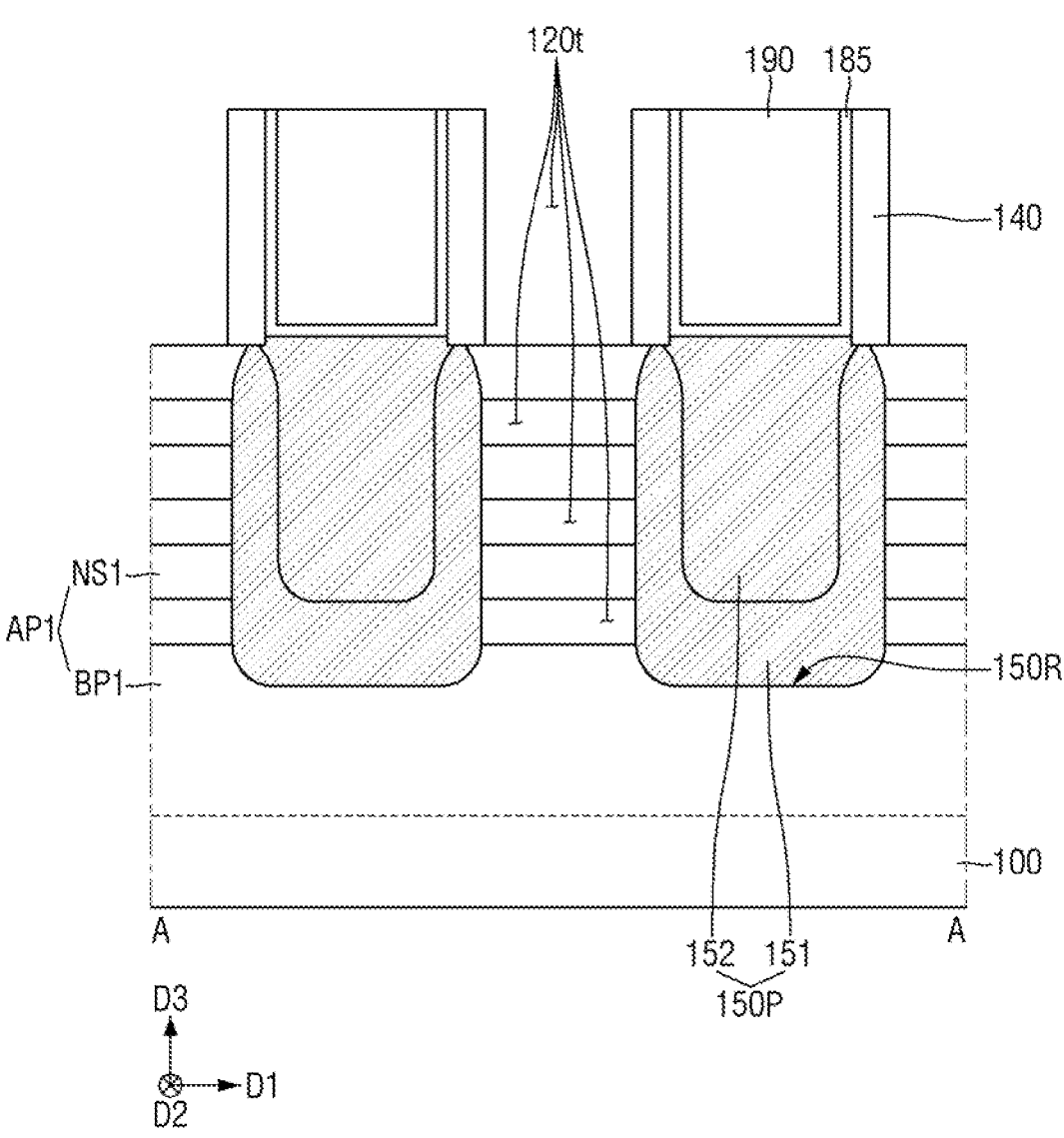

Referring to FIGS. 22 and 23, in an embodiment, the source/drain etching stop film 185 and the interlayer insulating film 190 are sequentially formed on the first pre-source/drain pattern 150P.

A part of the interlayer insulating film 190, a part of the source/drain etching stop film 185, and the dummy gate capping film 120_HM are removed to expose the upper surface of the dummy gate electrode 120p. The first gate spacer 140 is formed while the upper surface of the dummy gate electrode 120p is being exposed.

The dummy gate insulating film 130p and the dummy gate electrode 120p are removed to expose the upper pattern structure U_AP between the first gate spacers 140.

The sacrificial pattern SC_L is removed to form the first sheet pattern NS1 connected to the first pre-source/drain pattern 150P. A part of the first source/drain pattern 150 is exposed during the formation of the first sheet pattern NS1.

The dummy gate insulating film 130p, the dummy gate electrode 120p, and the sacrificial pattern SC_L are removed to form a first gate trench 120t.

Figure 24:
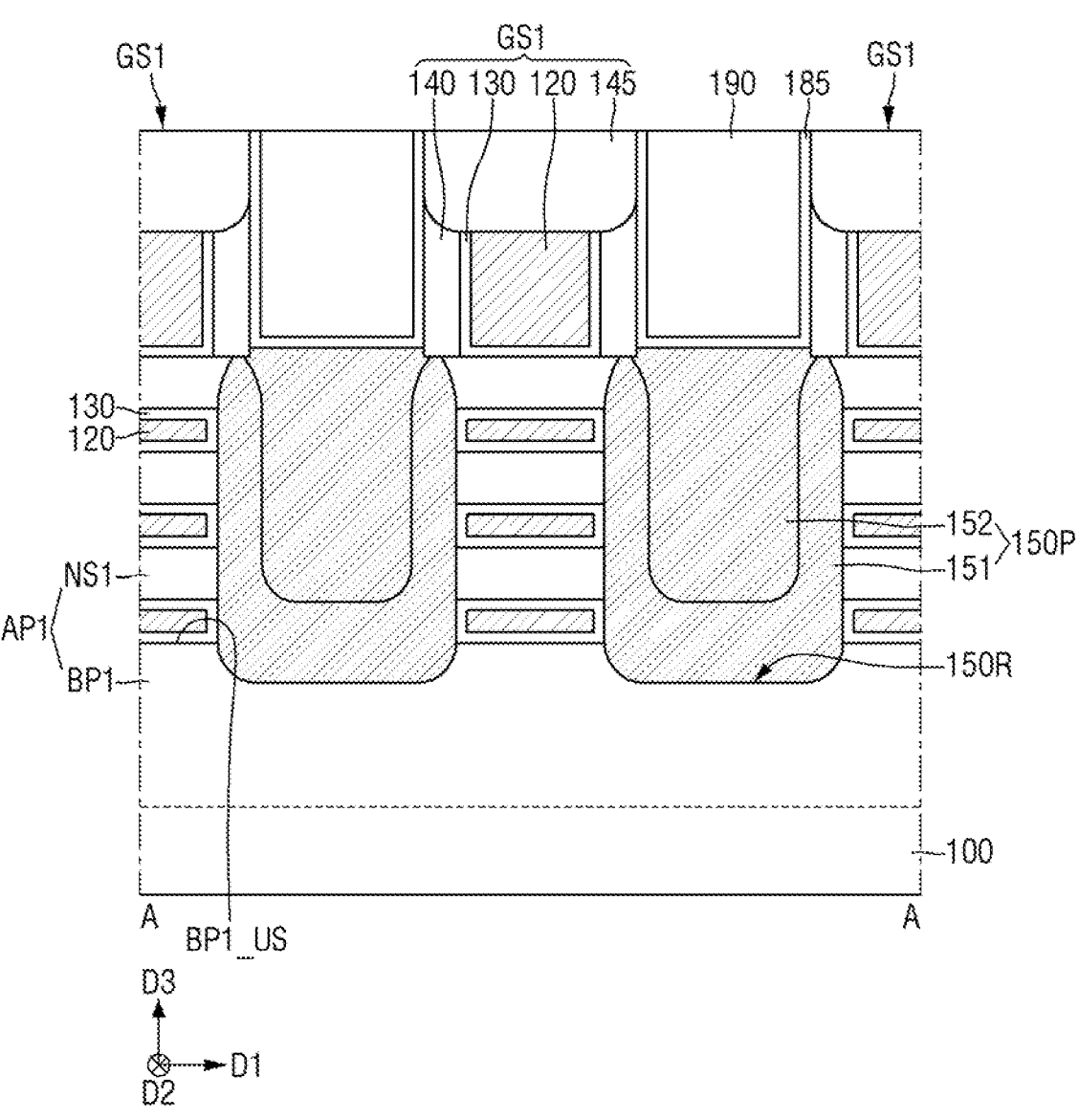

Referring to FIGS. 23 and 24, in an embodiment, the first gate insulating film 130 and the first gate electrode 120 are formed in the first gate trench 120t. The first gate insulating film 130 and the first gate electrode 120 surround the first sheet pattern NS1.

The first gate capping pattern 145 is formed on the first gate insulating film 130 and the first gate electrode 120.

Figure 25:
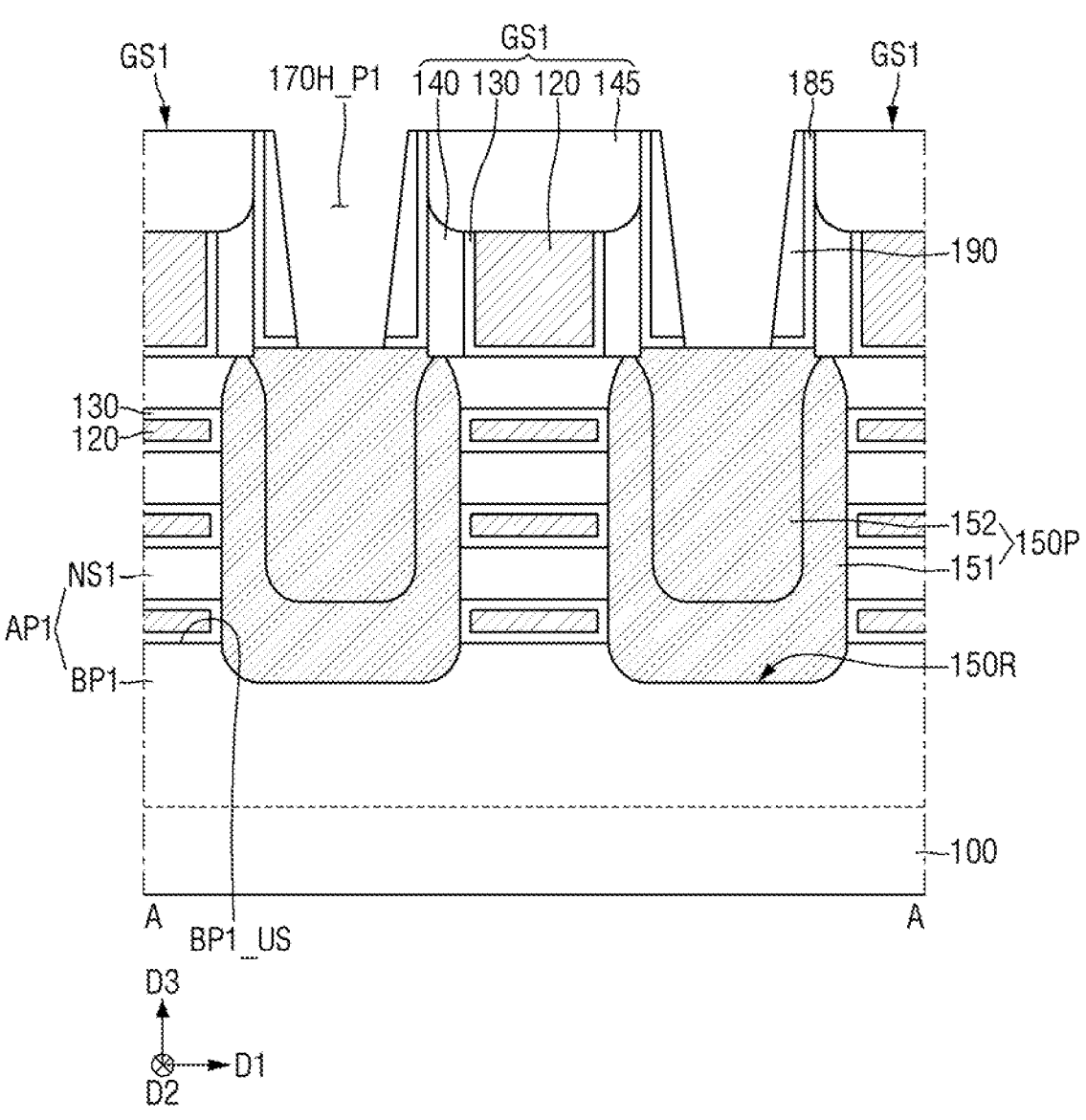

Referring to FIG. 25, a first pre-contact hole 170H_P1 is formed in the interlayer insulating film 190.

The first pre-contact hole 170H_P1 exposes the first pre-source/drain pattern 150P.

Figure 26:
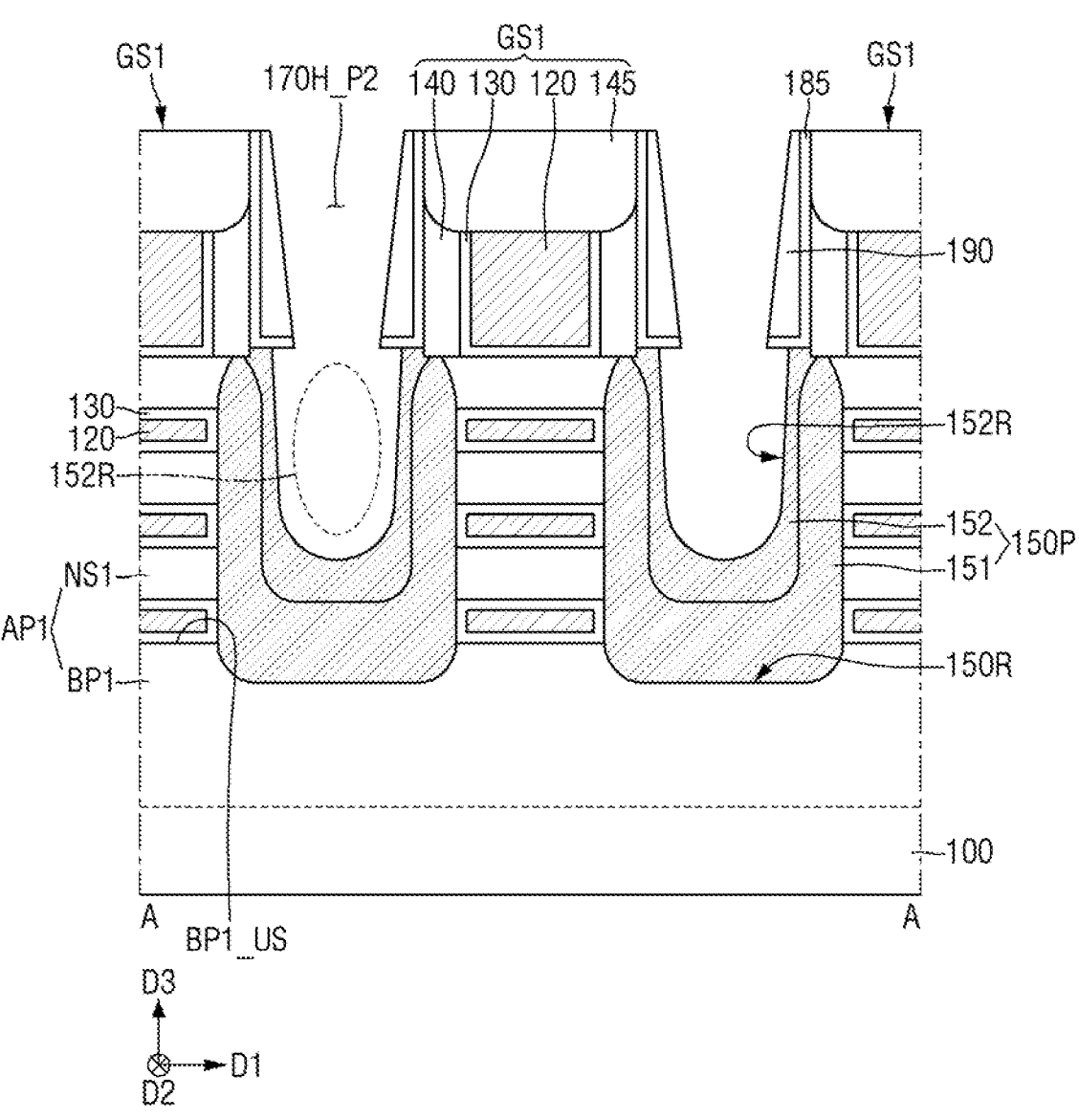

Referring to FIGS. 25 and 26, in an embodiment, a part of the first pre-source/drain pattern 150P exposed by the first pre-contact hole 170H_P1 is removed, and a semiconductor filling film recess 152R is formed in the first pre-source/drain pattern 150P.

The semiconductor filling film recess 152R is defined by the first pre-source/drain pattern 150P.

Accordingly, a second pre-contact hole 170H_P2 is formed in the interlayer insulating film 190 and the first pre-source/drain pattern 150P. The second pre-contact hole 170H_P2 includes the semiconductor filling film recess 152R defined by the first pre-source/drain pattern 150P.

In addition, a contact spacer is formed on the side walls of the first pre-contact hole 170H_P1, before removing a part of the first pre-source/drain pattern 150P. By forming the contact spacer, the shape of the first source/drain contact 170 as described in FIGS. 10 to 12 is formed. Although the contact spacer may be removed after formation of a contact hole 170H to be described below, embodiments are not necessarily limited thereto.

Figure 27:
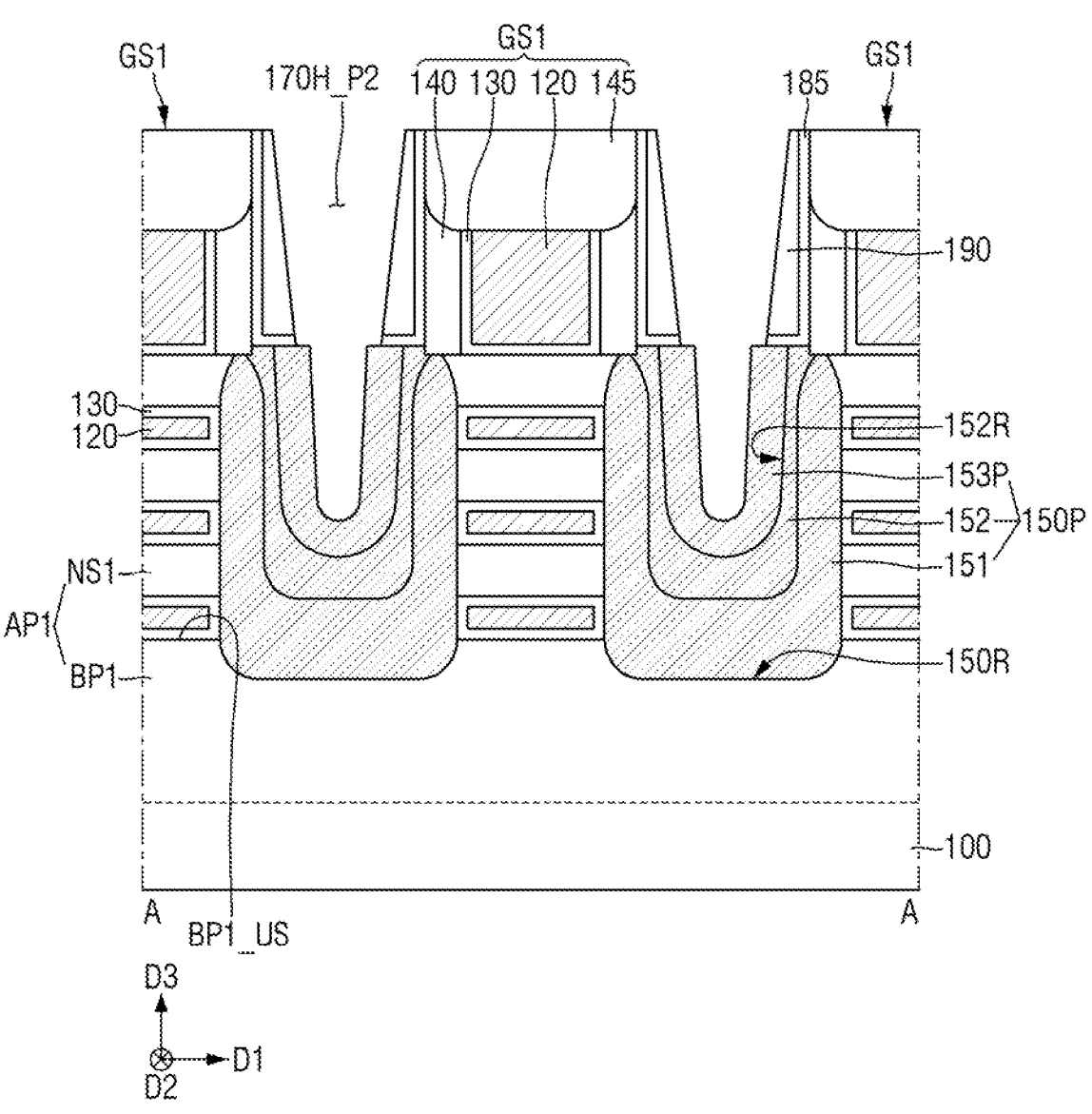

Referring to FIG. 27, in an embodiment, a pre-semiconductor insertion film 153P is formed along the profile of the semiconductor filling film recess 152R.

The first pre-source/drain pattern 150P includes a semiconductor liner film 151, a semiconductor filling film 152, and a pre-semiconductor insertion film 153P.

The pre-semiconductor insertion film 153P is formed using, for example, an epitaxial growth method.

Figure 28:
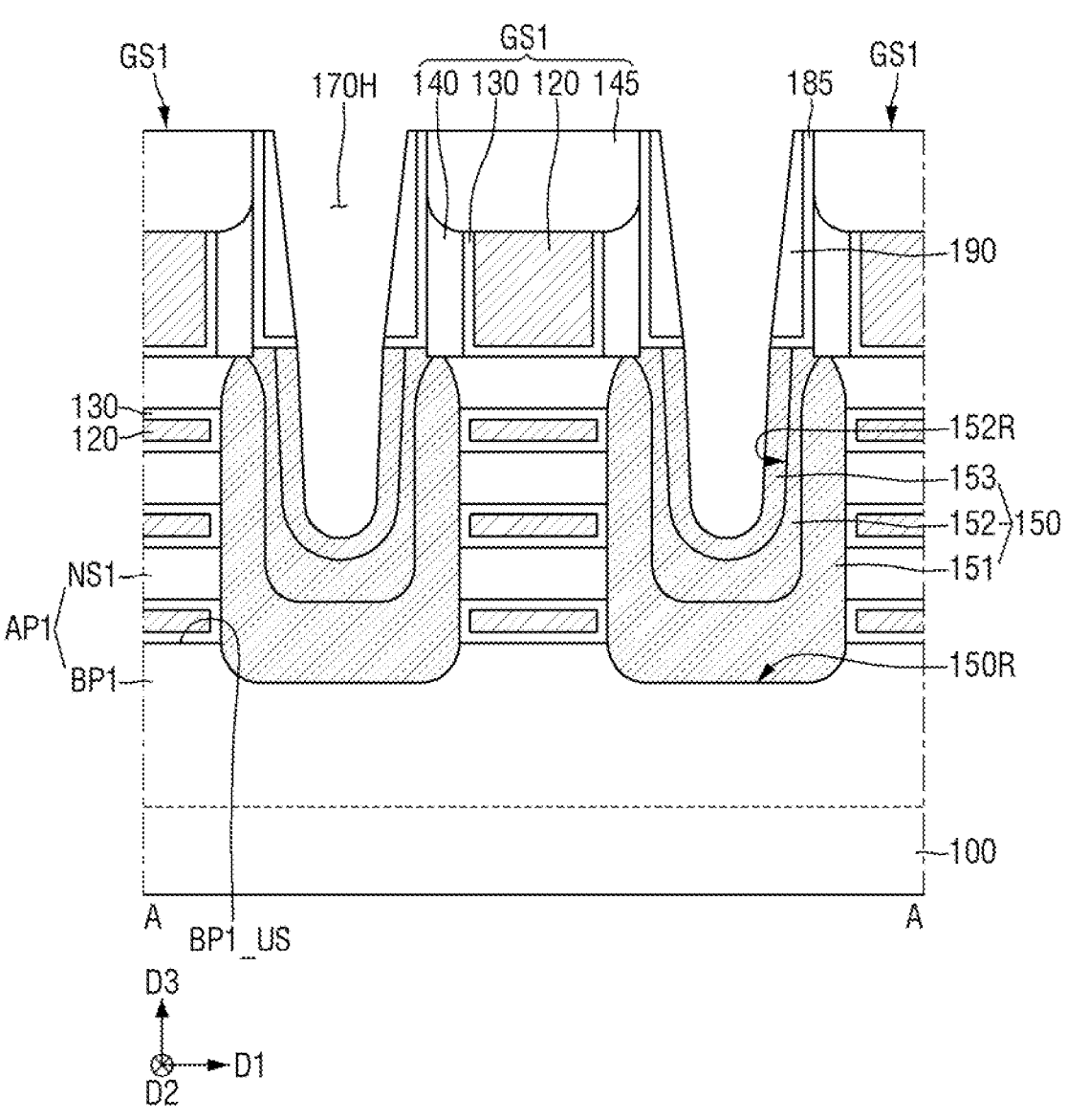

Referring to FIG. 28, in an embodiment, a part of the pre-semiconductor insertion film 153P is removed to form a contact hole 170H in the interlayer insulating film 190 and the first source/drain pattern 150.

A part of the pre-semiconductor insertion film 153P is removed to form the semiconductor insertion film 153. A part of the contact hole 170H is defined by the semiconductor insertion film 153.

The first source/drain pattern 150 includes the semiconductor liner film 151, the semiconductor filling film 152, and the semiconductor insertion film 153.

Referring to FIG. 2, in an embodiment, the first contact silicide film 155 is formed along the profile of the contact hole 170H defined by the first source/drain pattern 150. The first contact silicide film 155 is formed by using a part of the first source/drain pattern 150.

The first source/drain contact 170 connected to the first source/drain pattern 150 is formed in the contact hole 170H. The first source/drain contact 170 is formed on the first contact silicide film 155.

In concluding the detailed description, those skilled in the art will appreciate that many variations and modifications may be made to embodiments without substantially departing from the principles of the present inventive concept. Therefore, embodiments of the disclosure are used in a generic and descriptive sense only and not for purposes of limitation.

What is claimed is:

1. A semiconductor device, comprising:
an active pattern that extends in a first direction;
a plurality of gate structures disposed on the active pattern in a stacking direction and that are spaced apart in the first direction and include a gate electrode that extends in a second direction that crosses the first direction;
a source/drain recess formed between adjacent gate structures;
a source/drain pattern disposed in the source/drain recess on the active pattern;
a source/drain contact connected to the source/drain pattern, wherein the source/drain contact includes a lower part and an upper part, wherein the lower part of the source/drain contact is disposed in the source/drain pattern; and
a contact silicide film disposed along a profile of the lower part of the source/drain contact and between the source/drain contact and the source/drain pattern,
wherein the source/drain pattern includes:
a semiconductor liner film that extends along the source/drain recess and includes silicon germanium,
a semiconductor filling film disposed on the semiconductor liner film and that includes silicon germanium, and
a semiconductor insertion film that extends along side walls of the lower part of the source/drain contact and includes silicon germanium, and
wherein at least a portion of the contact silicide film is arranged between a side surface of the source/drain contact and the source/drain pattern in a direction perpendicular to the stacking direction, and the at least a portion of the contact silicide film conformally extends along the side surface of the source/drain contact facing the source/drain pattern.

2. The semiconductor device of claim 1, wherein a germanium fraction of the semiconductor filling film differs from a germanium fraction of the semiconductor liner film and a germanium fraction of the semiconductor insertion film.

3. The semiconductor device of claim 1, wherein the semiconductor filling film and the semiconductor insertion film each include p-type impurities, and
a concentration of p-type impurities of the semiconductor insertion film is greater than a concentration of p-type impurities of the semiconductor filling film.

4. The semiconductor device of claim 1, wherein the contact silicide film is not in contact with the semiconductor filling film.

5. The semiconductor device of claim 4, wherein the semiconductor insertion film extends along a bottom surface of the lower part of the source/drain contact.

6. The semiconductor device of claim 1, wherein the contact silicide film is in contact with the semiconductor filling film.

7. The semiconductor device of claim 6, wherein the semiconductor insertion film is not disposed along a bottom surface of the lower part of the source/drain contact.

8. The semiconductor device of claim 1, wherein the semiconductor insertion film is in contact with the semiconductor liner film.

9. The semiconductor device of claim 1, wherein a part of the semiconductor filling film extends along side walls of the source/drain recess to an upper surface of the active pattern.

10. The semiconductor device of claim 1, wherein an upper surface of the source/drain contact is coplanar with an upper surface of the plurality of gate structures.

11. The semiconductor device of claim 1, wherein an upper surface of the source/drain contact is lower than an upper surface of the plurality of gate structures.

12. The semiconductor device of claim 1, wherein the active pattern includes a lower pattern, and a plurality of sheet patterns that are spaced apart from the lower pattern in a third direction perpendicular to the first direction and the second direction, and
the gate electrode surrounds the plurality of sheet patterns.

13. A semiconductor device, comprising:
an active pattern that includes a lower pattern that extends in a first direction, and a sheet pattern spaced apart from the lower pattern in a second direction that crosses the first direction;
a plurality of gate structures that include gate electrodes that are spaced apart from each other in the first direction on the active pattern in a stacking direction and surround the sheet pattern, wherein the gate electrodes extend in a third direction that is normal to a plane defined by the first direction and the second direction;
a source/drain pattern disposed on the lower pattern, wherein the source/drain pattern is connected to the sheet pattern and includes a contact recess;
a contact silicide that extends along a profile of the contact recess; and
a source/drain contact disposed on the contact silicide and that fills the contact recess,
wherein the source/drain pattern includes:
a semiconductor liner film that includes silicon germanium and is disposed on the lower pattern,
a semiconductor filling film that includes silicon germanium and is disposed on the semiconductor liner film, and a semiconductor insertion film that includes silicon germanium and is disposed on the semiconductor filling film, wherein a germanium fraction of the semiconductor filling film differs from a germanium fraction of the semiconductor liner film and a germanium fraction of the semiconductor insertion film, wherein at least a part of the contact recess is defined by the semiconductor insertion film, and wherein at least a portion of the contact silicide is arranged between a side surface of the source/drain contact and the source/drain pattern in a direction perpendicular to the stacking direction, and the at least a portion of the contact silicide conformally extends along the side surface of the source/drain contact facing the source/drain pattern.

14. The semiconductor device of claim 13, wherein the semiconductor filling film and the semiconductor insertion film each include p-type impurities, and a concentration of the p-type impurities of the semiconductor insertion film is greater than a concentration of the p-type impurities of the semiconductor filling film.

15. The semiconductor device of claim 13, wherein the contact recess is entirely defined by the semiconductor insertion film.

16. The semiconductor device of claim 13, wherein the contact recess is defined by the semiconductor insertion film and the semiconductor filling film.

17. The semiconductor device of claim 13, wherein the semiconductor insertion film is in contact with the semiconductor liner film.

18. A semiconductor device, comprising:

an active pattern that includes a lower pattern and a sheet pattern disposed on the lower pattern;

a gate structure disposed on the active pattern in a stacking direction and that includes a gate electrode that surrounds the sheet pattern;

a source/drain pattern disposed on the lower pattern, is connected to the sheet pattern, and includes p-type impurities;

a source/drain contact connected to the source/drain pattern and that includes a lower part and an upper part, wherein the lower part of the source/drain contact is disposed in the source/drain pattern; and a contact silicide film disposed along a profile of the lower part of the source/drain contact between the source/drain contact and the source/drain pattern, wherein the source/drain pattern includes:

a silicon germanium liner film disposed on the lower pattern, a silicon germanium filling film disposed on the silicon germanium liner film and that includes a filling film recess, and a silicon germanium insertion film disposed on the silicon germanium filling film and that extends along at least a part of the filling film recess, wherein a germanium fraction of the silicon germanium filling film differs from a germanium fraction of the silicon germanium liner film and a germanium fraction of the silicon germanium insertion film, wherein a concentration of p-type impurities of the silicon germanium insertion film is greater than a concentration of p-type impurities of the silicon germanium filling film, and wherein at least a portion of the contact silicide film is arranged between a side surface of the source/drain contact and the source/drain pattern in a direction perpendicular to the stacking direction, and the at least a portion of the contact silicide film conformally extends along the side surface of the source/drain contact facing the source/drain pattern.

19. The semiconductor device of claim 18, wherein the silicon germanium insertion film is entirely disposed along the filling film recess.

20. The semiconductor device of claim 18, wherein the contact silicide film is in contact with the silicon germanium filling film.

* * * * *